(12) United States Patent
Kim et al.

(10) Patent No.: US 11,468,812 B2
(45) Date of Patent: Oct. 11, 2022

(54) DISPLAY APPARATUS

(71) Applicant: LG Display Co., Ltd., Seoul (KR)

(72) Inventors: Yeonkyung Kim, Paju-si (KR); TaeWoong Moon, Paju-si (KR); JunHyeon Bae, Paju-si (KR); Yewon Hong, Paju-si (KR); Yeonwoo Shin, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/366,445

(22) Filed: Jul. 2, 2021

(65) Prior Publication Data

US 2022/0069573 A1    Mar. 3, 2022

(30) Foreign Application Priority Data

Aug. 25, 2020  (KR) .................. 10-2020-0106887

(51) Int. Cl.
  *H02H 9/04* (2006.01)
  *H01L 27/02* (2006.01)
  *G09G 3/20* (2006.01)

(52) U.S. Cl.
  CPC ........... *G09G 3/20* (2013.01); *H01L 27/0292* (2013.01); *H02H 9/045* (2013.01); *G09G 2300/0426* (2013.01); *G09G 2300/0809* (2013.01); *G09G 2330/04* (2013.01); *H01L 27/0281* (2013.01)

(58) Field of Classification Search
  CPC .. H02H 9/045; G09G 3/20; G09G 2300/0426; G09G 2300/0809; G09G 2330/04; G09G 2330/08; G09G 3/3266; G09G 3/3674; G09G 2300/04; H01L 27/0281; H01L 27/0292

See application file for complete search history.

(56) References Cited

U.S. PATENT DOCUMENTS

| | | | | |
|---|---|---|---|---|
| 5,272,586 A | * | 12/1993 | Yen | ............. H02H 9/046 361/111 |
| 6,043,971 A | * | 3/2000 | Song | ............. G02F 1/136204 349/40 |
| 7,420,251 B2 | * | 9/2008 | Chen | ............. H01L 27/0285 361/111 |
| 8,179,643 B2 | * | 5/2012 | Moon | ............. H02H 9/046 361/56 |

(Continued)

*Primary Examiner* — Benyam Ketema
(74) *Attorney, Agent, or Firm* — Polsinelli PC

(57) ABSTRACT

A display apparatus comprises a display panel on which a plurality of pixels are displayed, a plurality of signal lines to which a signal required to drive the display panel is supplied, and an electrostatic discharge circuit connected between each of the plurality of signal lines and the electrostatic discharge line. The electrostatic discharge circuit includes first and second current paths between the signal line and the electrostatic discharge line, a first electrostatic discharge circuit connected to the first current path, including a plurality of first thin film transistors having a first gate electrode connected to the second current path and a second gate electrode connected to the first current path, and a second electrostatic discharge circuit connected to the second current path, including at least one second thin film transistor having a first gate electrode connected to the first current path and a second gate electrode connected to the first current path.

20 Claims, 12 Drawing Sheets

(56) References Cited

U.S. PATENT DOCUMENTS

| | | | | |
|---|---|---|---|---|
| 8,941,958 B2* | 1/2015 | Tomatsu | H01L 27/0266 | 361/91.1 |
| 9,515,064 B2* | 12/2016 | Sokabe | H01L 27/0266 | |
| 9,626,901 B2* | 4/2017 | Lee | G02F 1/136259 | |
| 9,772,532 B2* | 9/2017 | Kim | G02F 1/136204 | |
| 10,256,226 B2* | 4/2019 | Yoon | H01L 27/124 | |
| 10,503,035 B2* | 12/2019 | Yeom | H01L 27/0296 | |
| 10,762,862 B2* | 9/2020 | Chen | G09G 3/3648 | |
| 10,839,750 B2* | 11/2020 | Jung | G09G 3/20 | |
| 2002/0018154 A1* | 2/2002 | Yoo | G02F 1/136204 | 349/40 |
| 2006/0119757 A1* | 6/2006 | Tsao | G02F 1/136204 | 349/40 |
| 2007/0246778 A1* | 10/2007 | Liou | H01L 27/0266 | 257/362 |
| 2008/0043162 A1* | 2/2008 | Tung | G02F 1/136204 | 349/40 |
| 2008/0123004 A1* | 5/2008 | Lin | G09G 3/3648 | 349/40 |
| 2010/0110113 A1* | 5/2010 | Kimura | G09G 3/2014 | 257/296 |
| 2012/0087460 A1* | 4/2012 | Moriwaki | H01L 27/1214 | 377/64 |
| 2012/0268848 A1* | 10/2012 | Lin | H02H 9/046 | 361/56 |
| 2014/0071109 A1* | 3/2014 | Tseng | H02H 9/041 | 345/90 |
| 2014/0126093 A1* | 5/2014 | Duan | H02H 9/044 | 361/56 |
| 2014/0126094 A1* | 5/2014 | Duan | H02H 9/045 | 361/56 |
| 2015/0021595 A1* | 1/2015 | In | H01L 27/0266 | 257/43 |
| 2015/0053953 A1* | 2/2015 | Ebisuno | H01L 27/3279 | 257/40 |
| 2015/0255449 A1* | 9/2015 | Kim | G02F 1/136204 | 349/40 |
| 2015/0303686 A1* | 10/2015 | Li | H01L 27/0251 | 361/56 |
| 2017/0104051 A1* | 4/2017 | Gai | H01L 51/0021 | |
| 2017/0117705 A1* | 4/2017 | Sekine | H01L 27/124 | |
| 2017/0221417 A1* | 8/2017 | Jung | G09G 3/3258 | |
| 2018/0033806 A1* | 2/2018 | Long | H01L 27/0296 | |
| 2019/0109154 A1* | 4/2019 | Lin | H01L 27/14658 | |
| 2019/0204693 A1* | 7/2019 | Chen | G09G 3/3648 | |
| 2020/0349877 A1* | 11/2020 | Xiao | G09G 3/20 | |
| 2021/0043621 A1* | 2/2021 | Long | H01L 27/0259 | |
| 2021/0098446 A1* | 4/2021 | He | H01L 27/1225 | |
| 2021/0175223 A1* | 6/2021 | Long | H01L 27/0266 | |
| 2021/0281067 A1* | 9/2021 | Chen | H01L 27/0281 | |
| 2021/0358906 A1* | 11/2021 | Cai | H02H 9/045 | |
| 2021/0398970 A1* | 12/2021 | Long | H01L 27/1259 | |
| 2021/0408786 A1* | 12/2021 | Dundigal | H01L 27/0292 | |
| 2022/0093028 A1* | 3/2022 | Hong | G11C 19/00 | |

\* cited by examiner

DISPLAY APPARATUS

CROSS-REFERENCE TO RELATED APPLICATION

This application claims the benefit of the Korean Patent Application No. 10-2020-0106887 filed on Aug. 25, 2020, which is hereby incorporated by reference in its entirety as if fully set forth herein.

BACKGROUND

Field of the Disclosure

The present disclosure relates to a display apparatus.

Description of the Background

A display apparatus is embedded in electronic products or home appliances, such as a television, a monitor, a notebook computer, a smart phone, a tablet computer, an electronic pad, a wearable device, a watch phone, a portable information device, a navigator and a vehicle control display device, and is used as a screen for displaying an image.

The display apparatus comprises a display panel having a display area provided with pixels for displaying an image and a non-display area disposed outside the display area, not displaying an image. Also, the display apparatus includes a gate driver for supplying a gate signal to pixels through gate lines, a data driver for supplying a data voltage to pixels through data lines, and a timing controller for supplying signals to control the gate driver and the data driver.

The gate driver may directly be disposed at one side or both sides on the non-display area of the display panel and connected with a pixel. In this way, a gate driver disposed on a display panel will be referred to as a Gate In Panel (GIP) or Gate Driver-IC in Panel type gate driver.

The display apparatus cannot display an exact image and a driver, line, pixel, etc. may be damaged when static electricity of a high voltage enters the pixel. Therefore, the display apparatus comprises a protective device, for example, an electrostatic discharge circuits are connected in parallel at an entry end portion of a data line and an entry end portion of GIP.

The electrostatic discharge circuit bypasses an overcurrent to a ground or common voltage when static electricity of a high voltage occurs, so as to prevent the high voltage from entering the pixel, whereby the pixel and the line provided in the display panel may be prevented from being damaged.

A back channel etched (BCE) type oxide TFT is conventionally used as a thin film transistor (TFT) of an electrostatic discharge circuit. The demands for products of high resolution, large screen and high-speed driving are increasing, however, the BCE type oxide TFT has a problem in that it is not suitable for a large screen due to its great parasitic capacitance.

The disclosure of the above-described background art is owned by the inventor of the present disclosure to devise the present disclosure or is technical information acquired by a process of devising the present disclosure, but cannot be regarded as the known art disclosed to the general public before the present disclosure is disclosed.

SUMMARY

Accordingly, the present disclosure has been made in view of the above problems, and one or more aspects of the present disclosure provides a display apparatus comprising an electrostatic discharge circuit applicable to a display apparatus of a large screen.

One or more aspects of the present disclosure provides a display apparatus comprising an electrostatic discharge circuit that is applicable to a display apparatus of a large screen and may reduce a leakage current.

One or more aspects of the present disclosure provides a display apparatus comprising an electrostatic discharge circuit that is applicable to a display apparatus of a large screen by reducing a leakage current in an electrostatic discharge circuit comprised of a coplanar type thin film transistor (TFT).

In addition to the technical benefits of the present disclosure as mentioned above, additional technical benefits and features of the present disclosure will be clearly understood by those skilled in the art from the following description of the present disclosure.

In accordance with an aspect of the present disclosure, the above and other technical benefits can be accomplished by the provision of a display apparatus comprising a display panel on which a plurality of pixels are displayed, a plurality of signal lines to which a signal required to drive the display panel is supplied, and an electrostatic discharge circuit connected between each of the plurality of signal lines and the electrostatic discharge line.

The electrostatic discharge circuit includes first and second current paths between the signal line and the electrostatic discharge line, a first electrostatic discharge circuit connected to the first current path, including a plurality of first thin film transistors having a first gate electrode connected to the second current path and a second gate electrode connected to the first current path, and a second electrostatic discharge circuit connected to the second current path, including at least one second thin film transistor having a first gate electrode connected to the first current path and a second gate electrode connected to the first current path.

In addition to the features of the present disclosure as mentioned above, additional features of the present disclosure will be included within this description, be within the scope of the present disclosure, and be protected by the following claims. Nothing in this section should be taken as a limitation on those claims. Further aspects and advantages are discussed below in conjunction with aspects of the disclosure. It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Figure 1:
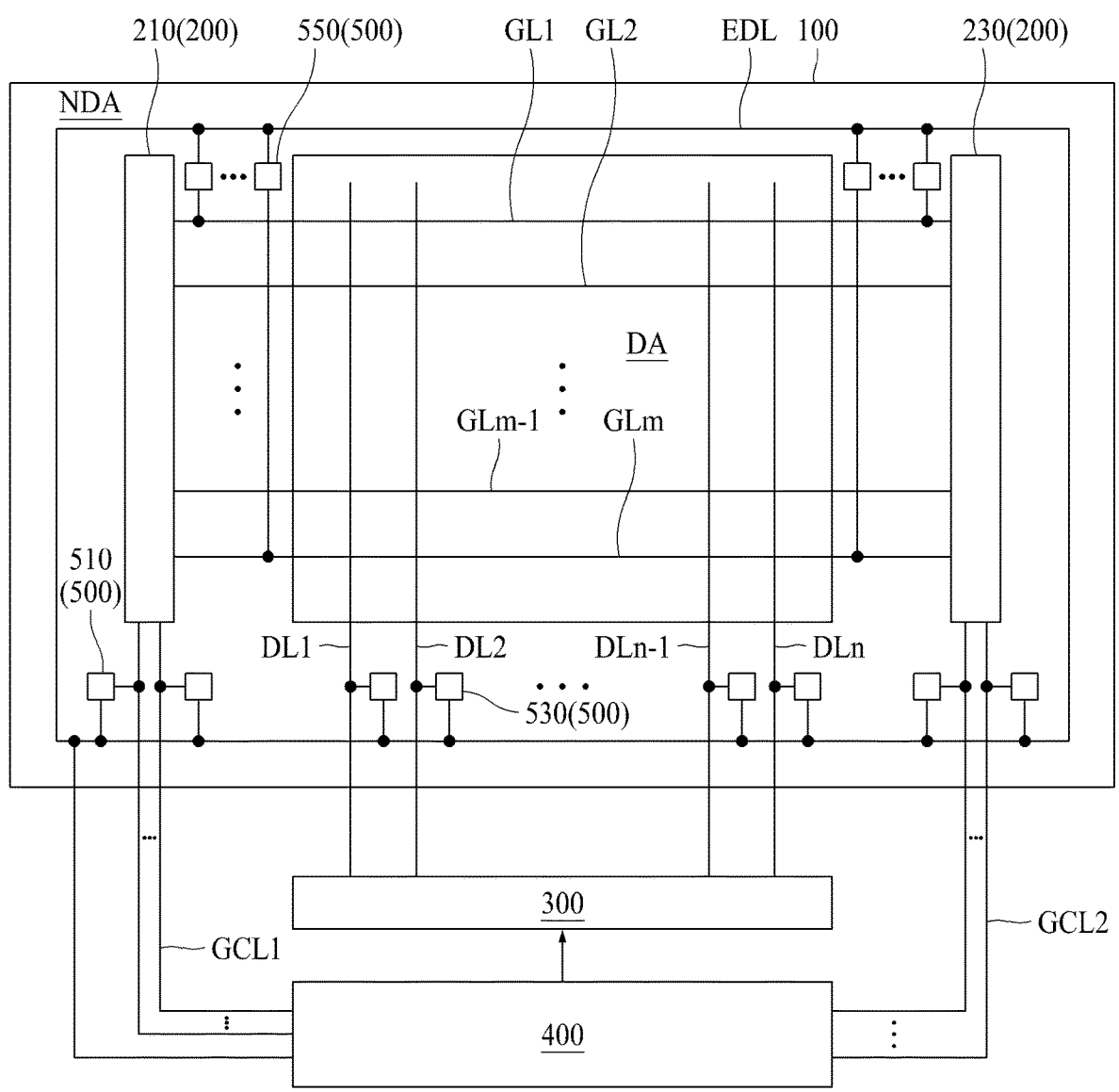
FIG. 1 is a view illustrating an example of a display apparatus according to the aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

Spatially relative terms such as "below", "beneath", "lower", "above", and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below", or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, a display panel comprising an electrostatic discharge circuit and a display apparatus comprising the display panel according to the aspect of the present disclosure will be described with reference to the accompanying drawings.

FIG. 1 is a view illustrating an example of a display apparatus according to the aspect of the present disclosure.

A display apparatus 1 according to the aspect of the present disclosure may be a display apparatus, which may embody a color, such as a Liquid Crystal Display device (LCD), an Organic Light Emitting Display (OLED), an Electrophoretic Display (EPD), a Plasma Display Panel device (PDP), a Field Emission Display device (FED), an Electro luminescence Display device (ELD), and an Electro-Wetting Display (EWD).

Referring to FIG. 1, the display apparatus 1 according to the aspect of the present disclosure may include a display panel 100, a gate driver 200, a data driver 300, a controller 400, and an electrostatic discharge circuit 500.

The display panel 100 includes a plurality of gate lines GL1 to GLm, a plurality of data lines DL1 to DLn, and a pixel P disposed per pixel area defined by intersection between the gate lines GL1 to GLm and the data lines DL1 to DLn. For example, an area on which pixels Ps are disposed to display an image may be referred to as a display area DA (or active area AA), and an area in the periphery of the display area DA may be referred to as a non-display area NDA (or non-active area NAA). The plurality of gate lines GL1 to GLm and the plurality of data lines DL1 to DLn constitute pixel driving lines for driving the pixel.

Also, an electrostatic discharge line EDL is disposed on the display panel 100, and a ground line connected with the ground, a common line for supplying a common voltage Vcom, etc. may be used as the electrostatic discharge line EDL in this aspect, but the present disclosure is not limited to this example.

For example, the electrostatic discharge line EDL may be disposed on the non-display area NDA. In accordance with the aspect, the electrostatic discharge line EDL may be disposed to surround the display area DA along an edge of the non-display area NDA.

The gate driver 200 is controlled by a gate control signal transmitted from the controller 400, and sequentially outputs a gate on signal Gon (or gate pulse GP), which may turn on a switching element, to the gate lines GL1 to GLm for one frame. In this case, one frame means a period when one image is output through the display panel 100.

Also, the gate driver 200 outputs a gate off signal Goff, which may turn off a switching element, to the gate lines GL1 to GLm for the other period of one frame when the gate on signal is not supplied. The gate on signal Gon and the gate off signal Goff will collectively be referred to as a scan signal SS.

The gate driver 200 may output a gate high voltage VGH as the gate on signal (or gate pulse), and may output a gate low voltage VGL as a gate off signal.

In this aspect, the gate driver 200 is provided in a gate in panel (GIP) structure, and may be disposed on the non-display panel NDA of the display panel 100. Also, the gate driver 200 may be disposed only at one side of the display panel 100, or may be disposed at the other side of the display panel 100. In this aspect, two gate drivers, that is, first and second gate drivers 210 and 230 are respectively disposed at both sides of the display panel 100.

When the first and second gate drivers 210 and 230 are provided like this aspect, the first and second gate drivers 210 and 230 may be comprised of a plurality of stages that include a shift register. The first and second gate drivers 210 and 230 may alternately output the gate high voltage VGH, which is the gate on signal, to the gate lines GL1 to GLm disposed on the display panel 100, in response to a gate control signal GCS from the controller 400.

The data driver 300 converts image data RGB input from the controller 400 into analog data voltages and then supplies data voltages Vdata of one horizontal line to the data lines DL every one horizontal period when the gate on signal Gon is supplied to the gate line GL, whereby each pixel P displays brightness based on image data.

The controller 400 controls the gate driver 200 and the data driver 300 by using various timing signals (ex, vertical synchronization signal, horizontal synchronization signal, clock signal, etc.) supplied from an external system (not shown).

The controller 400, for example, may output a gate control signal GCS for controlling the gate driver 200 and a data control signal DCS for controlling the data driver 300. Also, the controller 400 may sample image data input from the external system and then realign the sampled image data to output the realigned data to the data driver 300.

The electrostatic discharge circuit 500 is disposed to prevent elements (ex, driver, pixel, line, etc.) on the display panel 100 from being damaged or destructed from an overvoltage entering there due to occurrence of static electricity. For example, the electrostatic discharge circuit 500 may bypass an overvoltage current caused by static electricity to the electrostatic discharge line EDL when the static electricity occurs.

According to this aspect, the electrostatic discharge circuit 500 is disposed between a signal line SL to which a signal required to drive the display panel 100 and the electrostatic discharge line EDL, and discharges static electricity generated in the signal line through the electrostatic discharge line EDL.

For example, the electrostatic discharge circuit 500 may include a first electrostatic discharge circuit 510, a second electrostatic discharge circuit 530, and a third electrostatic discharge circuit 550.

The first electrostatic discharge circuit 510 is connected between a gate control line GCL, which connects the gate driver 200 with the controller 400 to transfer the gate control signal GCS output from the controller 400 to the gate driver 200, and the electrostatic discharge line EDL to discharge the overvoltage entering the gate control line GCL, through the electrostatic discharge line EDL.

In this aspect, since the gate driver 200 includes first and second gate drivers 210 and 230, the first electrostatic discharge circuit 510 may be connected between a first gate control line GCL1 and the electrostatic discharge line EDL and between a second gate control line GCL2 and the electrostatic discharge line EDL.

The second electrostatic discharge circuit 530 may be connected between the data line DL and the electrostatic discharge line EDL to discharge the overvoltage entering the data lines DL1 to DLn, through the electrostatic discharge line EDL.

For example, each of the data lines DL1 to DLn may include a first area disposed in the non-display area NDA, and a second area extended from the first area and disposed in the display area DA, and the second electrostatic discharge circuit 530 may be connected between the second area of each of the data lines DL1 to DLn and the electrostatic discharge line EDL.

The third electrostatic discharge circuit 550 may be connected between the gate line GL and the electrostatic discharge line EDL to discharge the overvoltage entering the gate lines GL1 to GLm, through the electrostatic discharge line EDL.

For example, each of the gate lines GL1 to GLm may include a first are disposed in the non-display area NDA, and a second area extended from the first area and disposed in the display area, and the third electrostatic discharge circuit 550 may be connected between the second area of each of the gate lines GL1 to GLm and the electrostatic discharge line EDL.

The electrostatic discharge circuit 500 according to this aspect may include a plurality of double gate coplanar type Thin Film Transistors (TFTs). In the present disclosure, the double gate type means that two gates are applied to the thin film transistor.

Figure 2:
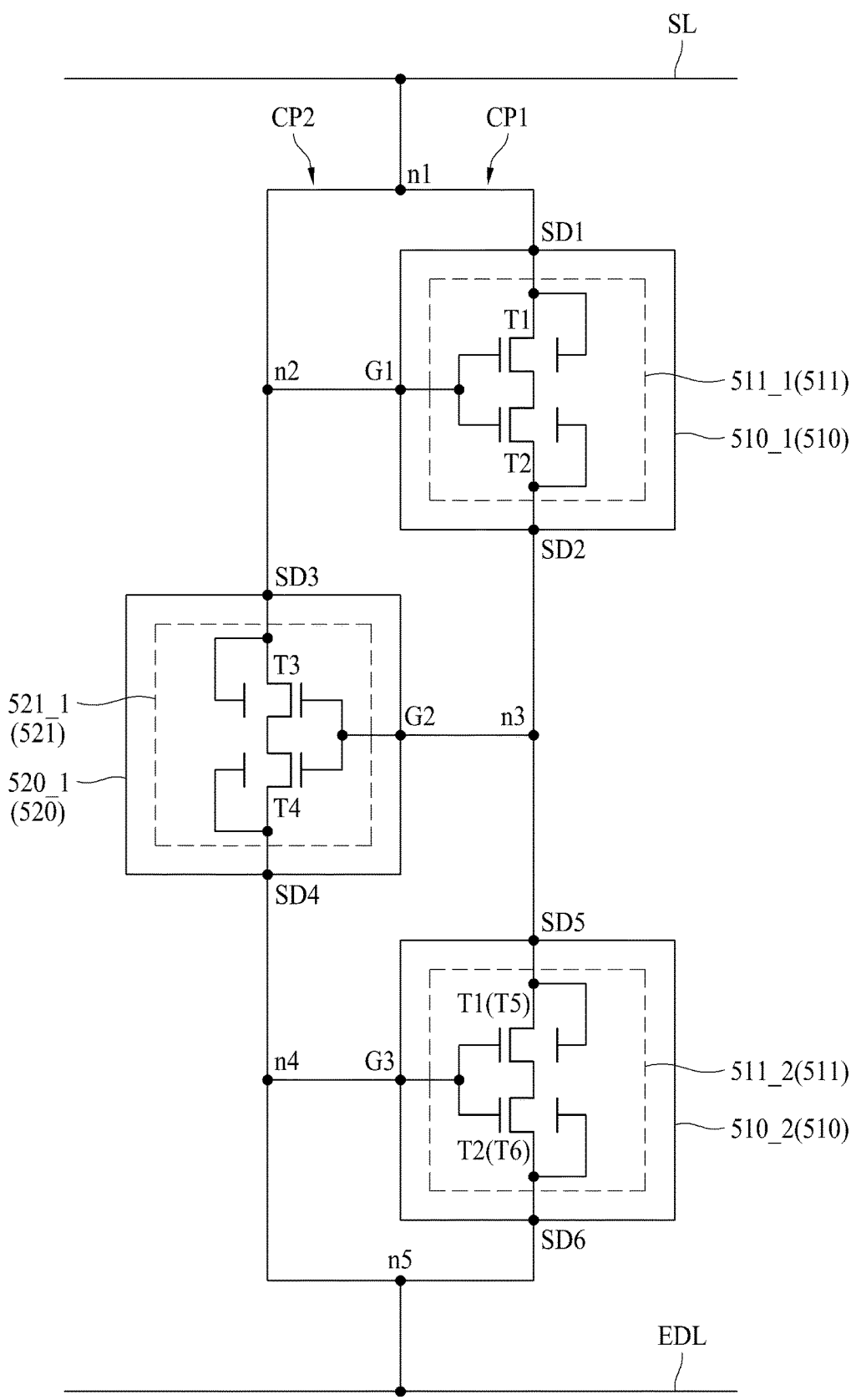
FIG. 2 is a view illustrating an equivalent circuit of an electrostatic discharge circuit according to one aspect of the present disclosure.

FIG. 2 is a view illustrating an equivalent circuit of an electrostatic discharge circuit according to one aspect of the present disclosure.

Referring to FIG. 2, the electrostatic discharge circuit 500 may be disposed between the signal line SL and the electrostatic discharge line EDL to bypass the overcurrent caused by the overcurrent to the electrostatic discharge line EDL when the overvoltage enters the signal line SL. For example, the signal line SL may be one of the gate control line GCL, the data line DL and the gate line GL, and the electrostatic discharge line EDL may be a common line or a ground line.

According to this aspect, the electrostatic discharge circuit 500 includes a current path CP (or discharge path) between the signal line SL and the electrostatic discharge line EDL. For example, the electrostatic discharge circuit 500 may include a first current path CP1 and a second current path CP2, which are connected in parallel between the signal line SL and the electrostatic discharge line EDL.

Also, the electrostatic discharge circuit 500 may include a plurality of thin film transistors connected to the first current path CP1 and the second current path CP2 to form a current path between the signal line SL and the electrostatic discharge line EDL when the overvoltage enters there, and each of the plurality of thin film transistors may be a double gate coplanar type thin film transistor.

For example, the electrostatic discharge circuit 500 may be comprised of a plurality of first thin film transistors 510 connected to the first current path CP1, and at least one second thin film transistor 520 connected to the second current path CP2. For example, the plurality of first thin film transistors 510 may constitute the first electrostatic discharge circuit, and at least one second thin film transistor 520 may constitute the second electrostatic discharge circuit.

In FIG. 2, the electrostatic discharge circuit 500 includes two first thin film transistors 510_1 and 510_2 and one second thin film transistor 520_1, and the number of the first and second thin film transistors 510 and 520 is not limited to the example of FIG. 2.

The first thin film transistor 510 has a first gate electrode connected to the first current path CP1 in series and connected to the second current path CP2, and a second gate electrode connected to the first current path CP1.

The second thin film transistor 520 has a first gate electrode connected to the second current path CP2 in series and connected to the first current path CP1, and a second gate electrode connected to the second current path CP2.

The (1-1)th thin film transistor 510_1 is turned on by a positive (+) overvoltage entering the signal line SL, the second thin film transistor 520 is turned on in response to turn-on of the (1-1)th thin film transistor 510_1, and the (1-2)th thin film transistor 510_2 is turned on in response to turn-on of the second thin film transistor 520.

In this way, when the positive (+) overvoltage enters the signal line SL, the (1-1)th thin film transistor 510_1, the second thin film transistor 520 and the (1-2)th thin film transistor 510_2 are sequentially turned on. Therefore, the overcurrent generated by the positive (+) overvoltage entering the signal line SL bypasses to the electrostatic discharge line EDL through the first and second current paths CP1 and CP2, whereby the positive (+) overvoltage may be discharged.

Meanwhile, when a negative (−) overvoltage enters the signal line SL, a voltage of the electrostatic discharge line EDL relatively becomes high, whereby the (1-2)th thin film transistor 510_2, the second thin film transistor 520 and the (1-1)th thin film transistor 510_1 are sequentially turned on. Therefore, the overcurrent generated by the negative (−) overvoltage entering the signal line SL bypasses to the electrostatic discharge line EDL through the first and second current paths CP1 and CP2, whereby the negative (−) overvoltage may be discharged.

Therefore, the electrostatic discharge circuit 500 according to the aspect of the present disclosure may perform a bidirectional operation, and may discharge the positive (+) overvoltage and the negative (−) overvoltage, which enter the signal line SL.

The first and second thin film transistors 510 and 520 according to this aspect may include at least one or more unit thin film transistors 511 and 521 that include two (or a pair of) sub thin film transistors connected in series. The sub thin film transistor according to this aspect is a double gate coplanar type thin film transistor.

In accordance with the aspect, the first unit thin film transistor 511 and the second unit thin film transistor 521 may have the same structure, or may have their respective structures different from each other.

FIG. 2 illustrates that the first thin film transistor 510 is comprised of one first unit thin film transistor 511 and the second thin film transistor 520 is comprised of one second thin film transistor 521, but the present disclosure is not limited to the example of FIG. 2.

In accordance with the aspect, the first thin film transistor 510 may have a structure in which a plurality of first unit thin film transistors 511 are connected in series. In accordance with the aspect, the second thin film transistor 520 may have a structure in which a plurality of second unit thin film transistors 521 are connected in series.

According to this aspect, a first source/drain electrode SD1 of the first thin film transistor 510_1 (hereinafter, (1-1)th thin film transistor) disposed at a first stage on the first current path CP1 based on the signal line SL is connected to the signal line SL, and a second source/drain electrode SD2 of the (1-1)th thin film transistor 510_1 is connected to a first source/drain electrode SD5 of the second thin film transistor 510 (hereinafter, (1-1)th thin film transistor 510_2 disposed at a next stage (or second stage) and a gate electrode G2 of the second thin film transistor 520, and a gate electrode G1 of the (1-1)th thin film transistor 510_1 is connected to the signal line SL.

A first source/drain electrode SD3_of the second thin film transistor 520 connected to the second current path CP2 based on the signal line SL is connected to the signal line SL, a second source/drain electrode SD4_of the second thin film transistor 520 is connected to the electrostatic discharge line EDL, and the gate electrode G2 of the second thin film transistor 520 is connected to the second source/drain electrode SD2 of the (1-1)th thin film transistor 510_1. Also, the first source/drain electrode SD3_of the second thin film transistor 520 is connected to the gate electrode G1 of the (1-1)th thin film transistor 510_1, and the second source/drain electrode SD4_of the second thin film transistor 520 is connected to a gate electrode G3 of the (1-2)th thin film transistor 510_2.

A first source/drain electrode SD5 of the first thin film transistor 510_2 (hereinafter, (1-2)th thin film transistor) disposed at a second stage on the first current path CP1 based on the signal line SL is connected to the second source/drain electrode SD2 of the (1-1)th thin film transistor 510_1, a second source/drain electrode SD6 of the (1-2)th thin film transistor 510_2 is connected to the electrostatic discharge line EDL, and the gate electrode G3 of the (1-2)th thin film transistor 510 2 is connected to the second source/drain electrode SD4_of the second thin film transistor 520. Also, the gate electrode G3 of the (1-2)th thin film transistor 510_2 is connected to the electrostatic discharge line EDL.

The gate electrode G1 of the (1-1)th thin film transistor 510_1, the gate electrode G2 of the second thin film transistor 520 and the gate electrode G3 of the (1-2)th thin film transistor 510_2 may be expressed as the first gate electrodes.

As described above, the first source/drain electrode SD1 and the gate electrode G1 of the (1-1)th thin film transistor 510_1 are commonly connected to the signal line SL, the first source/drain electrode SD3_of the second thin film transistor 520 is connected to the signal line SL, the gate electrode G2 of the second thin film transistor 520 is connected to the second source/drain electrode SD2 of the (1-1)th thin film transistor 510_1, the first source/drain electrode SD5 of the (1-2)th thin film transistor 510_2 is connected to the second source/drain electrode SD2, and the second source/drain electrode SD6 and the gate electrode G3 of the (1-2)th thin film transistor 510_2 are commonly connected to the electrostatic discharge line EDL.

Therefore, when the overvoltage enters the signal line SL, the (1-1)th thin film transistor 510_1, the second thin film transistor 520 and the (1-2)th thin film transistor 510_2 are sequentially turned on. Therefore, the overcurrent generated by the overvoltage entering the signal line SL bypasses to the electrostatic discharge line EDL through the first and second current paths CP1 and CP2, whereby the overvoltage may be discharged.

According to this aspect, the first and second thin film transistors 510 and 520 may include at least one or more unit thin film transistors that include two (or a pair of) sub thin film transistors connected in series.

For example, the first thin film transistor 510 may include a first unit thin film transistor 511 that includes two (or a pair of) sub thin film transistors T1 and T2 connected in series, and the second thin film transistor 520 may include a second unit thin film transistor 521 that includes two (or a pair of) sub thin film transistors T3 and T4 connected in series.

In accordance with the aspect, the first thin film transistor 510 may include one or a plurality of first unit thin film transistors 511, and the second thin film transistor 520 may include one or a plurality of second unit thin film transistors 521. The plurality of first unit thin film transistors 511 are connected in series, and the plurality of second unit thin film transistors 521 are connected in series.

Figure 3:
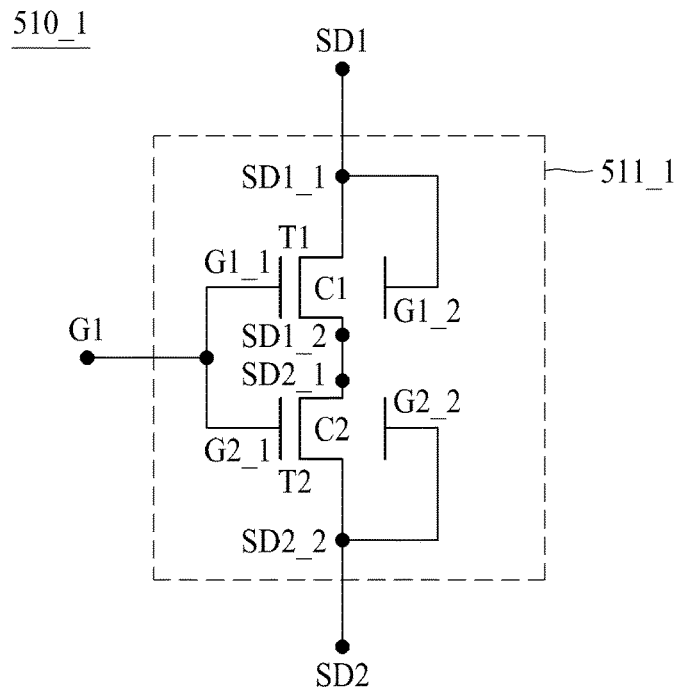
FIG. 3 is a view illustrating a (1-1)th thin film transistor of FIG. 2.

FIG. 3 is a view illustrating the (1-1)th thin film transistor of FIG. 2.

Referring to FIGS. 2 and 3, the (1-1)th thin film transistor 510_1 includes at least one or more first unit thin film transistor 511_1, and the first unit thin film transistor 511_1 may be comprise of two double gate coplanar type sub thin film transistors T1 and T2 connected in series. The first sub thin film transistor T1 is disposed at a side of the signal line SL, and the second sub thin film transistor T2 is disposed at a side of the electrostatic discharge line EDL.

A first source/drain SD1_1 of the first sub thin film transistor T1 is connected to the signal line SL, a second source/drain SD1_2 of the first sub thin film transistor T1 is connected to a first source/drain SD2_1 of the second sub thin film transistor T2, a first gate electrode G1_1 of the first sub thin film transistor T1 is connected to a second current path CL2, and a second gate electrode G1_2 of the first sub thin film transistor T1 is connected to the first source/drain SD1_1 of the first sub thin film transistor T1.

A first source/drain SD2_1 of the second sub thin film transistor T2 is connected to the second source/drain SD1_2 of the first sub thin film transistor T 1, a second source/drain SD2_2 of the second sub thin film transistor T2 is connected to a first source/drain electrode SD5 of the (1-2)th thin film transistor 510_2 and the gate electrode G2 of the second thin film transistor 520, a first gate electrode G2_1 of the second sub thin film transistor T2 is connected to a second current path CP2, and a second gate electrode G2_2 of the second sub thin film transistor T2 is connected to the second source/drain SD2_2 of the second sub thin film transistor T2.

The second gate electrode G1_2 of the first sub thin film transistor T1 and the second gate electrode G2_2 of the second sub thin film transistor T2 may constitute the second gate electrode of the (1-1)th thin film transistor 510_1.

In accordance with the aspect, the first gate electrode may be expressed as an upper gate electrode or a top gate electrode, and the second gate electrode may be expressed as a lower gate electrode or a bottom gate electrode. In accordance with the aspect, the second gate electrode may be comprised of a light shield. In accordance with the aspect, the first source/drain SD1_1, a channel portion C1 and the second source/drain SD1_2 of the first sub thin film transistor T1 may be formed on the same layer as the first source/drain SD2_1, a channel portion C2 and the second source/drain SD2_2 of the second sub thin film transistor T2. For example, the first source/drain SD1_1, the channel portion C1 and the second source/drain SD1_2 of the first sub thin film transistor T1 and the first source/drain SD2_1, the channel portion C2 and the second source/drain SD2_2 of the second sub thin film transistor T2 may constitute one semiconductor layer.

In accordance with the aspect, the second source/drain SD1_2 of the first sub thin film transistor T1 and the first source/drain SD2_1 of the second sub thin film transistor T2 may be one element. For example, an area between the channel portion C1 of the first sub thin film transistor T1 and the channel portion C2 of the second sub thin film transistor T2 may serve as the second source/drain SD1_2 of the first sub thin film transistor T1 and the first source/drain SD2_1 of the second sub thin film transistor T2.

In accordance with the aspect, the first source/drain SD1_1 of the first sub thin film transistor T1 may constitute the first source/drain electrode SD1 of the (1-1)th thin film transistor 510_1, and the second source/drain SD2_2 of the second sub thin film transistor T2 may constitute the second source/drain electrode SD2 of the (1-1)th thin film transistor 510_1. In accordance with the aspect, the first source/drain SD1_1 of the first sub thin film transistor T1 may serve as the first source/drain electrode SD1 of the (1-1)th thin film transistor 510_1, and the second source/drain SD2_2 of the second sub thin film transistor T2 may serve as the second source/drain electrode SD2 of the (1-1)th thin film transistor 510_1. In accordance with the aspect, the first gate electrode G1_1 of the first sub thin film transistor T1 and the first gate electrode G2_1 of the second sub thin film transistor T2 may constitute the gate electrode G1 of the (1-1)th thin film transistor 510_1 or serve as the gate electrode G1.

According to this aspect, the second gate electrode G1_2 of the first sub thin film transistor T1 is connected to the first source/drain SD1_1 of the first sub thin film transistor Ti, and the second gate electrode G2_2 of the second sub thin film transistor T2 is connected to the second source/drain SD2_2 of the second sub thin film transistor T2.

Therefore, when the (1-1)th thin film transistor 510_1 is turned on, a voltage of the first source/drain electrode SD1 is applied to the second gate electrode G1_2 of the first sub thin film transistor T1, and a voltage of the second source/drain electrode SD2 is applied to the second gate electrode G2_2 of the second sub thin film transistor T2.

Since the second gate electrode G1 2 of the first sub thin film transistor T1 is connected with the first source/drain electrode SD1 which becomes the drain electrode, the first sub thin film transistor T1 operates as a double gate transistor, and since the second gate electrode G2_2 of the second sub thin film transistor T2 is connected with the second source/drain electrode SD2 which becomes the source electrode, the second sub thin film transistor T2 operates as a single gate transistor.

Since the first sub thin film transistor T1 and the second sub thin film transistor T2 are connected with each other in series, a current output through the (1-1)th thin film transistor 510_1 is determined by characteristics of the second sub thin film transistor T2. Since the second sub thin film transistor T2 operates as a single gate transistor, the output current of the (1-1)th thin film transistor 510_1 is limited to a current value of the second sub thin film transistor T2, whereby a leakage current may be reduced.

Figure 4:
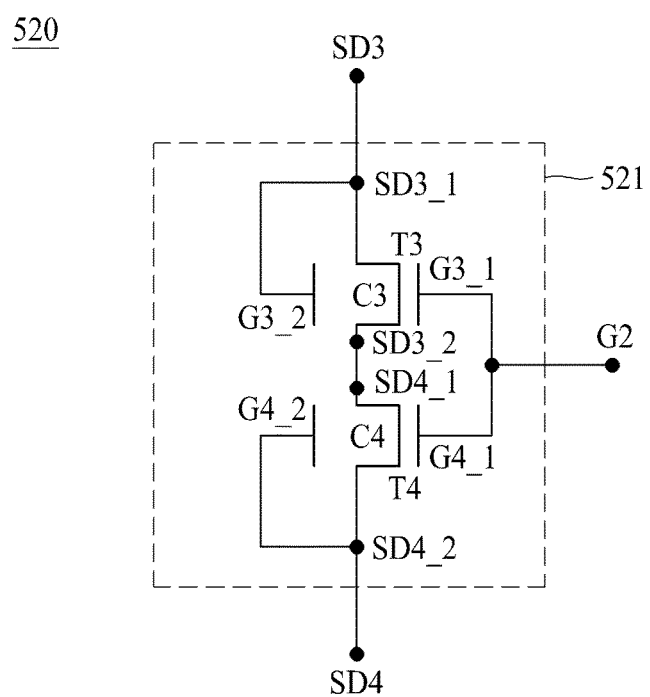
FIG. 4 is a view illustrating a second thin film transistor of FIG. 2.

FIG. 4 is a view illustrating the second thin film transistor of FIG. 2.

Referring to FIGS. 2 and 4, the second thin film transistor 520 includes at least one or more second unit thin film transistor 521, and the second unit thin film transistor 521 may be comprise of two double gate coplanar type sub thin film transistors T3 and T4 connected in series. The third sub thin film transistor T3 is disposed at a side of the signal line SL, and the fourth sub thin film transistor T4 is disposed at a side of the electrostatic discharge line EDL.

A first source/drain SD3_1 of the third sub thin film transistor T3 is connected to the signal line SL, a second source/drain SD3_2 of the third sub thin film transistor T3 is connected to a first source/drain SD4_1 of the fourth sub thin film transistor T4, a first gate electrode G3_1 of the third sub thin film transistor T3 is connected between the (1-1)th thin film transistor 510_1 and the (1-2)th thin film transistor 510_2, and a second gate electrode G3_2 of the third sub thin film transistor T3 is connected to the first source/drain SD3_1 of the third sub thin film transistor T3.

A first source/drain SD4_1 of the fourth sub thin film transistor T4 is connected to the second source/drain SD3_2 of the third sub thin film transistor T3, a second source/drain SD4_2 of the fourth sub thin film transistor T4 is connected to the gate electrode G3 of the (1-2)th thin film transistor 510_2 and the electrostatic discharge line EDL, a first gate electrode G4_1 of the fourth sub thin film transistor T4 is connected between the (1-1)th thin film transistor 510_1 and the (1-2)th thin film transistor 510_2, and a second gate electrode G4_2 of the fourth sub thin film transistor T4 is connected to the second source/drain SD4_2 of the fourth sub thin film transistor T4.

The second gate electrode G3_2 of the third sub thin film transistor T3 and the second gate electrode G4_2 of the fourth sub thin film transistor T4 may constitute the second gate electrode of the second thin film transistor 520.

In accordance with the aspect, the first gate electrode may be expressed as an upper gate electrode or a top gate electrode, and the second gate electrode may be expressed as a lower gate electrode or a bottom gate electrode. In accordance with the aspect, the second gate electrode may be comprised of a light shield. In accordance with the aspect, the first source/drain SD3_1, a channel portion C3 and the second source/drain SD3_2 of the third sub thin film transistor T3 may be formed on the same layer as the first source/drain SD4_1, a channel portion C4 and the second source/drain SD4_2 of the fourth sub thin film transistor T4. For example, the first source/drain SD3_1, the channel portion C3 and the second source/drain SD3_2 of the third sub thin film transistor T3 and the first source/drain SD4_1, the channel portion C4 and the second source/drain SD4_2 of the fourth sub thin film transistor T4 may constitute one semiconductor layer.

In accordance with the aspect, the second source/drain SD3_2 of the third sub thin film transistor T3 and the first source/drain SD4_1 of the fourth sub thin film transistor T4 may be one element. For example, an area between the channel portion C3 of the third sub thin film transistor T3 and the channel portion C4 of the fourth sub thin film transistor T4 may serve as the second source/drain SD3_2 of the third sub thin film transistor T3 and the first source/drain SD4_1 of the fourth sub thin film transistor T4.

In accordance with the aspect, the first source/drain SD3_1 of the third sub thin film transistor T3 may constitute the first source/drain electrode SD3_of the second thin film transistor 520, and the second source/drain SD4_2 of the fourth sub thin film transistor T4 may constitute the second source/drain electrode SD4_of the second thin film transistor 520. In accordance with the aspect, the first source/drain SD3_1 of the third sub thin film transistor T3 may serve as the first source/drain electrode SD3_of the second thin film transistor 520, and the second source/drain SD4_2 of the fourth sub thin film transistor T4 may serve as the second source/drain electrode SD4_of the second thin film transistor 520. In accordance with the aspect, the first gate electrode G3_1 of the third sub thin film transistor T3 and the first gate electrode G4_1 of the fourth sub thin film transistor T4 may constitute the gate electrode G2 of the second thin film transistor 520 or serve as the gate electrode G2.

According to this aspect, the second gate electrode G3_2 of the third sub thin film transistor T3 is connected to the first source/drain SD3_1 of the third sub thin film transistor T3, and the second gate electrode G4_2 of the fourth sub thin film transistor T4 is connected to the second source/drain SD4_2 of the fourth sub thin film transistor T4.

Therefore, when the second thin film transistor 520 is turned on, a voltage of the first source/drain electrode SD3_is applied to the second gate electrode G3_2 of the third sub thin film transistor T3, and a voltage of the second source/drain electrode SD2 is applied to the second gate electrode G4_2 of the fourth sub thin film transistor T4.

Since the second gate electrode G3_2 of the third sub thin film transistor T3 is connected with the first source/drain electrode SD3_which becomes the drain electrode, the third sub thin film transistor T3 operates as a double gate transistor, and since the second gate electrode G4_2 of the fourth sub thin film transistor T4 is connected with the second source/drain electrode SD4 which becomes the source electrode, the fourth sub thin film transistor T4 operates as a single gate transistor.

Since the third sub thin film transistor T3 and the fourth sub thin film transistor T4 are connected with each other in series, a current output through the second thin film transistor 520 is determined by characteristics of the fourth sub thin film transistor T4. Since the fourth sub thin film transistor T4 operates as a single gate transistor, the output current of the second thin film transistor 520 is limited to a current value of the fourth sub thin film transistor T4, whereby a leakage current may be reduced.

Figure 5:
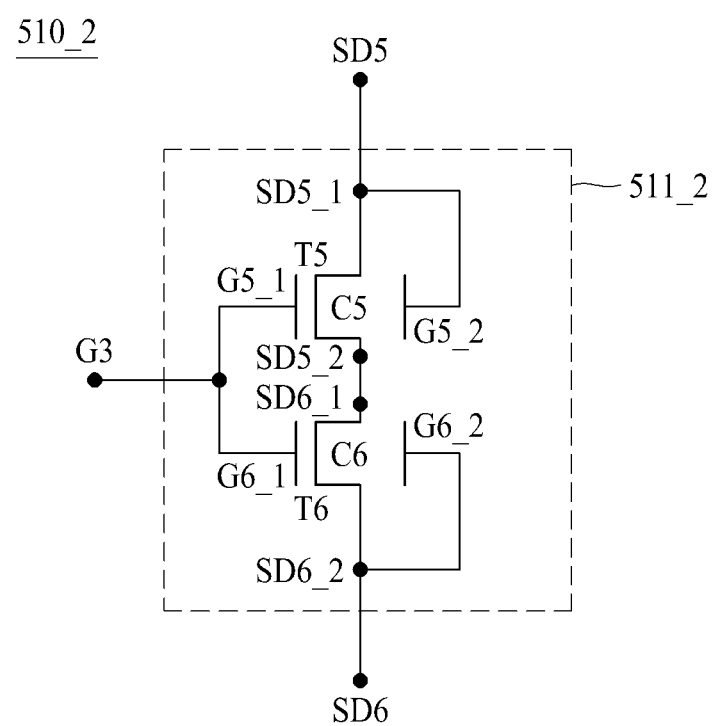
FIG. 5 is a view illustrating a (1-2)th thin film transistor of FIG. 2.

FIG. 5 is a view illustrating the (1-2)th thin film transistor of FIG. 2.

Referring to FIGS. 2 and 5, the (1-2)th thin film transistor 510_2 includes at least one or more first unit thin film transistor 511_2, and the first unit thin film transistor 511_2 may be comprise of two double gate coplanar type sub thin film transistors T1 and T2 connected in series.

The first unit thin film transistor 511_2 of the (1-2)th thin film transistor 510_2 has the same structure as that of the first unit thin film transistor 511_1 of the (1-1)th thin film transistor 510_1, and reference numerals given to the first unit thin film transistor 511_1 of the (1-1)th thin film transistor 510_1 may equally be given to the first unit thin film transistor 511_2 of the (1-2)th thin film transistor 510_2.

Therefore, although it may be described that the first unit thin film transistor 511_2 of the (1-2)th thin film transistor 510_2 includes the first and second sub thin film transistors T1 and T2, for convenience of description, it is described that the first unit thin film transistor 511_2 of the (1-2)th thin film transistor 510_2 includes fifth and sixth sub thin film transistors T5 and T6. The fifth sub thin film transistor T5 is disposed at a side of the signal line SL, and the sixth sub thin film transistor T6 is disposed at a side of the electrostatic discharge line EDL.

A first source/drain SD5_1 of the fifth sub thin film transistor T5 is connected to the second source/drain electrode SD1 of the (1-1)th thin film transistor 510_1 and the gate electrode G2 of the second thin film transistor 520, a second source/drain SD5_2 of the fifth sub thin film transistor T5 is connected to a first source/drain SD6_1 of the sixth sub thin film transistor T2, a first gate electrode G5_1 of the fifth sub thin film transistor T5 is connected to the second source/drain electrode SD4_of the second thin film transistor 520 and the electrostatic discharge line EDL, and a second gate electrode G5_2 of the fifth sub thin film transistor T5 is connected to the first source/drain SD5_1 of the fifth sub thin film transistor T5.

A first source/drain SD6_1 of the sixth sub thin film transistor T6 is connected to the second source/drain SD5_2 of the fifth sub thin film transistor T5, a second source/drain SD6_2 of the sixth sub thin film transistor T6 is connected to the electrostatic discharge line EDL, a first gate electrode G6_1 of the sixth sub thin film transistor T6 is connected to the second source/drain electrode SD4_of the second thin film transistor 520 and the electrostatic discharge line EDL, and a second gate electrode G6_2 of the sixth sub thin film transistor T6 is connected to the second source/drain SD6_2 of the sixth sub thin film transistor T6.

The second gate electrode G5_2 of the fifth sub thin film transistor T5 and the second gate electrode G6_2 of the sixth sub thin film transistor T6 may constitute the second gate electrode of the (1-2)th thin film transistor 510_2.

In accordance with the aspect, the first gate electrode may be expressed as an upper gate electrode or a top gate electrode, and the second gate electrode may be expressed as a lower gate electrode or a bottom gate electrode. In accordance with the aspect, the second gate electrode may be comprised of a light shield. In accordance with the aspect, the first source/drain SD5_1, a channel portion C5 and the second source/drain SD5_2 of the fifth sub thin film transistor T5 may be formed on the same layer as the first source/drain SD6_1, a channel portion C6 and the second source/drain SD6_2 of the sixth sub thin film transistor T6. For example, the first source/drain SD5_1, the channel portion C5 and the second source/drain SD5_2 of the fifth sub thin film transistor T5 and the first source/drain SD6_1, the channel portion C6 and the second source/drain SD6_2 of the sixth sub thin film transistor T6 may constitute one semiconductor layer.

In accordance with the aspect, the second source/drain SD5_2 of the fifth sub thin film transistor T5 and the first source/drain SD6_1 of the sixth sub thin film transistor T6 may be one element. For example, an area between the channel portion C5 of the fifth sub thin film transistor T5 and the channel portion C6 of the sixth sub thin film transistor T6 may serve as the second source/drain SD5_2 of the fifth sub thin film transistor T5 and the first source/drain SD6_1 of the sixth sub thin film transistor T6.

In accordance with the aspect, the first source/drain SD5_1 of the fifth sub thin film transistor T5 may constitute the first source/drain electrode SD5 of the (1-2)th thin film transistor 510_2, and the second source/drain SD6_2 of the sixth sub thin film transistor T6 may constitute the second source/drain electrode SD6 of the (1-2)th thin film transistor 510_2. In accordance with the aspect, the first source/drain SD5_1 of the fifth sub thin film transistor T5 may serve as the first source/drain electrode SD5 of the (1-2)th thin film transistor 510_2, and the second source/drain SD6_2 of the sixth sub thin film transistor T6 may serve as the second source/drain electrode SD6 of the (1-2)th thin film transistor 510_2. In accordance with the aspect, the first gate electrode G5_1 of the fifth sub thin film transistor T5 and the first gate electrode G62_1 of the sixth sub thin film transistor T6 may constitute the gate electrode G3 of the (1-2)th thin film transistor 510_2 or serve as the gate electrode G3.

According to this aspect, the second gate electrode G5_2 of the fifth sub thin film transistor T5 is connected to the first source/drain SD5_1 of the fifth sub thin film transistor T5, and the second gate electrode G6_2 of the sixth sub thin film transistor T6 is connected to the second source/drain SD6_2 of the sixth sub thin film transistor T6.

Therefore, when the (1-2)th thin film transistor 510_2 is turned on, a voltage of the first source/drain electrode SD5 is applied to the second gate electrode G5_2 of the fifth sub thin film transistor T5, and a voltage of the second source/drain electrode SD6 is applied to the second gate electrode G6_2 of the sixth sub thin film transistor T6.

Since the second gate electrode G5_2 of the fifth sub thin film transistor T5 is connected with the first source/drain electrode SD5 which becomes the drain electrode, the fifth sub thin film transistor T5 operates as a double gate transistor, and since the second gate electrode G6_2 of the sixth sub thin film transistor T6 is connected with the second source/drain electrode SD6 which becomes the source electrode, the sixth sub thin film transistor T6 operates as a single gate transistor.

Since the fifth sub thin film transistor T5 and the sixth sub thin film transistor T6 are connected with each other in series, a current output through the (1-2)th thin film transistor 510_2 is determined by characteristics of the sixth sub thin film transistor T6. Since the sixth sub thin film transistor T6 operates as a single gate transistor, the output current of the (1-2)th thin film transistor 510_2 is limited to a current value of the sixth sub thin film transistor T6, whereby a leakage current may be reduced.

The electrostatic discharge circuit 500 described with reference to FIGS. 2 to 5 is comprised of two first thin film transistors 510 and one second thin film transistor 520, and each thin film transistor is comprised of one unit thin film transistor 511, 521. However, the electrostatic discharge circuit 500 is not limited to this structure.

Figure 6:
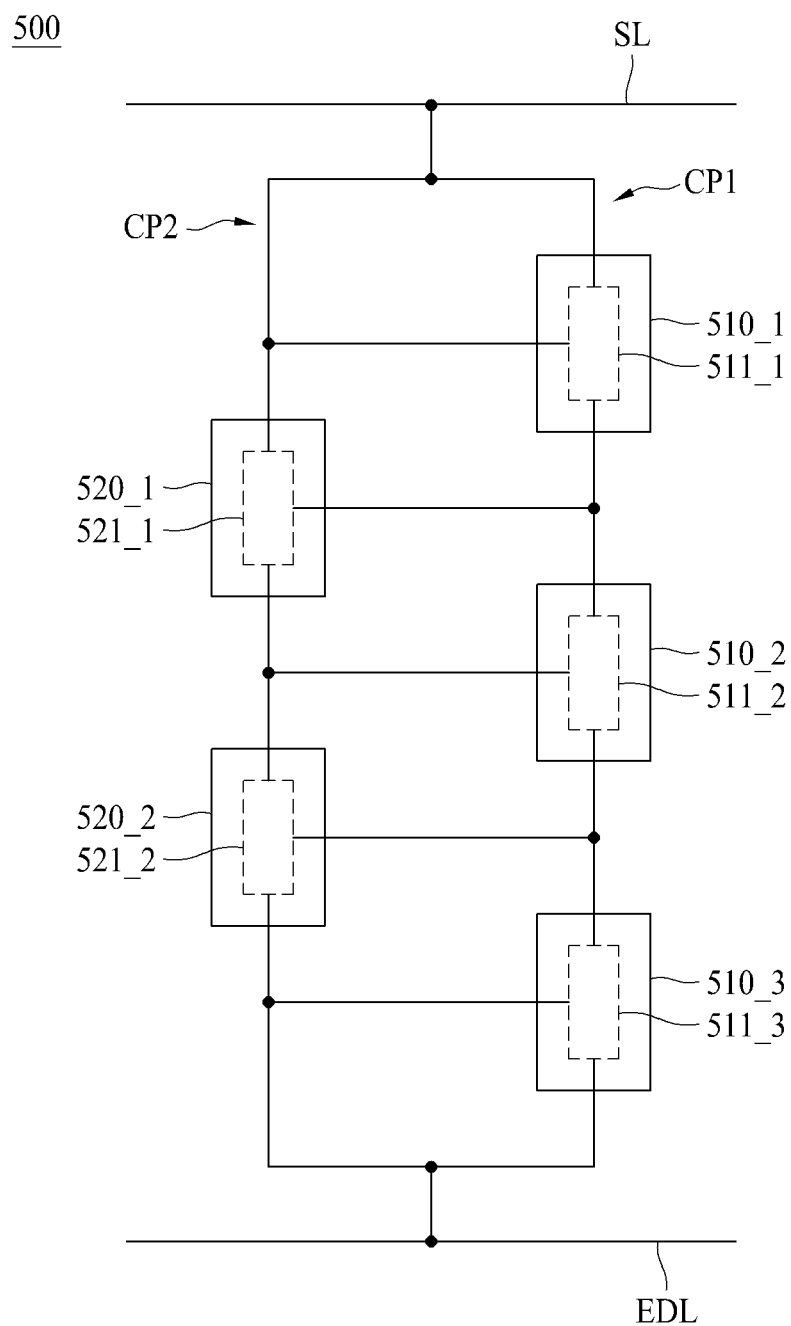
FIGS. 6 and 7 are block diagrams illustrating an equivalent circuit of an electrostatic discharge circuit according to another aspect of the present disclosure.
Figure 7:
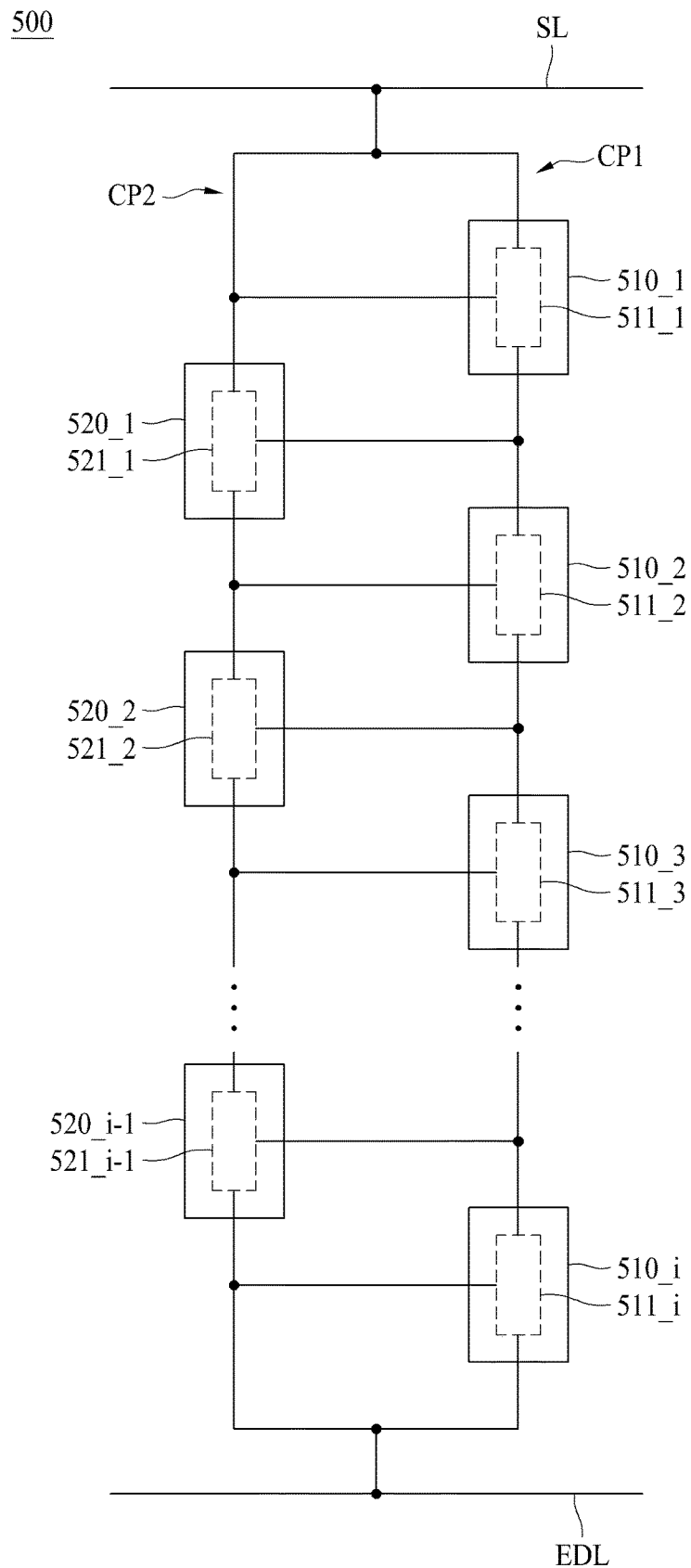

FIGS. 6 and 7 are block diagrams illustrating an equivalent circuit of an electrostatic discharge circuit according to another aspect of the present disclosure.

The electrostatic discharge circuit 500 of FIGS. 6 and 7 is embodied by increasing the number of the first and second thin film transistors 510 and 520 of the electrostatic discharge circuit 500 in FIG. 2. Since the first and second thin film transistors of the electrostatic discharge circuit 500 in FIGS. 6 and 7 have the same structure as that of the first and second thin film transistors described with reference to FIGS. 2 to 5, their repeated description will be omitted or briefly described.

Referring to FIG. 6, the electrostatic discharge circuit 500 may be comprised of five thin film transistors, and may include three first thin film transistors 510_1, 510_2 and 510_3, and two second thin film transistors 520_1 and 520_2.

Each of the first thin film transistors 510_1, 510_2 and 510_3 may include at least one or more first unit thin film transistors 511_1, 511_2 and 511_3, and each of the second thin film transistors 520_1 and 520_2 may include at least one or more second unit thin film transistors 521_1 and 521_2.

The three first thin film transistors 510_1, 510_2 and 510_3 are connected to the first current path CP1 in series, and the two second thin film transistors 520_1 and 520_2 are connected to the second current path CP2 in series.

Each of the second thin film transistors 520_1 and 520_2 is disposed among the first thin film transistors 510_1, 510_2 and 510_3. For example, the (2-1)th thin film transistor 520_1 may be disposed between the (1-1)th thin film transistor 510_1 and the (1-2)th thin film transistor 510_2, and the (2-2)th thin film transistor 520_2 may be disposed between the (1-2)th thin film transistor 510_2 and the (1-3)th thin film transistor 510_3.

A gate electrode (or first gate electrode) of each of the first thin film transistors 510_1, 510_2 and 510_3 is connected to the second current path CP2, and a gate electrode (or first gate electrode) of each of the second thin film transistors 520_1 and 520_2 is connected to the first current path CP1.

The (1-1)th thin film transistor 510_1 is turned on by the overvoltage entering the signal line SL, the (2-1)th thin film transistor 520_1 is turned on in response to turn-on of the (1-1)th thin film transistor 510_1, the (1-2)th thin film transistor 510_2 is turned on in response to turn-on of the (2-1)th thin film transistor 520_1, the (2-2)th thin film transistor 520_2 is turned on in response to turn-on of the (1-2)th thin film transistor 510_2, and the (1-3)th thin film transistor 510_3 is turned on in response to turn-on of the (2-2)th thin film transistor 520_2.

As described above, when the overvoltage enters the signal line SL, the (1-1)th thin film transistor 510_1, the (2-1)th thin film transistor 520_1, the (1-2)th thin film transistor 510_2, the (2-2)th thin film transistor 520_2 and the (1-3)th thin film transistor 510_3 are sequentially turned on. Therefore, the overcurrent generated by the overvoltage entering the signal line SL bypasses to the electrostatic discharge line EDL through the first and second current paths CP1 and CP2, whereby the overvoltage may be discharged.

Referring to FIG. 7, the electrostatic discharge circuit 500 may include i number of first thin film transistors 510_1 to 510_i (i is a natural number of 4 or more) and (i-1) number of second thin film transistors 520 1 to 520_i-1.

Each of the first thin film transistors 510_1 to 510_i may include at least one or more first unit thin film transistors 511_1 to 511_i, and each of the second thin film transistors 520 1 to 520_i-1 may include at least one or more second unit thin film transistors 521_1 to 521_i-1.

The i number of first thin film transistors 510_1 to 510_i are connected to the first current path CP1 in series, and the (i-1) number of second thin film transistors 520_1 to 520_i-1 are connected to the second current path CP2 in series.

Each of the second thin film transistors 520_1 to 520_i-1 is disposed among the first thin film transistors 510_1 to 510_i. For example, the (2-1)th thin film transistor 520_1 may be disposed between the (1-1)th thin film transistor 510_1 and the (1-2)th thin film transistor 510_2, the (2-2)th thin film transistor 520_2 may be disposed between the (1-2)th thin film transistor 510_2 and the (1-3)th thin film transistor 510_3, and the (2-(i-1))th thin film transistor 520_i-1 may be disposed between the (1-(i-1))th thin film transistor 510_i-1 and the (1-i)th thin film transistor 510_i.

A gate electrode (or first gate electrode) of each of the first thin film transistors 510_1 to 510_i is connected to the second current path CP2, and a gate electrode (or first gate electrode) of each of the second thin film transistors 520_1 to 520_i-1 is connected to the first current path CP1.

The (1-1)th thin film transistor 510_1 is turned on by the overvoltage entering the signal line SL, and the thin film transistors 520_1 to 510_i disposed at a rear end of the (1-1)th thin film transistor 510_1 are sequentially turned on as the (1-1)th thin film transistor 510_1 is turned on. Therefore, the overcurrent generated by the overvoltage entering the signal line SL bypasses to the electrostatic discharge line EDL through the first and second current paths CP1 and CP2, whereby the overvoltage may be discharged.

Referring to FIGS. 6 and 7, the electrostatic discharge circuit 500 may include n number of first thin film transistors 510 (n is a natural number of 2 or more) connected to the first current path CP1 in series and (n-1) number of second thin film transistors 520 connected to the second current path CP2 in series.

In the electrostatic discharge circuit 500 described as above, each of the first and second thin film transistors 510 and 520 includes one unit thin film transistor 511, 521. However, each of the first and second thin film transistors 510 and 520 may include a plurality of unit thin film transistors.

Figure 8:
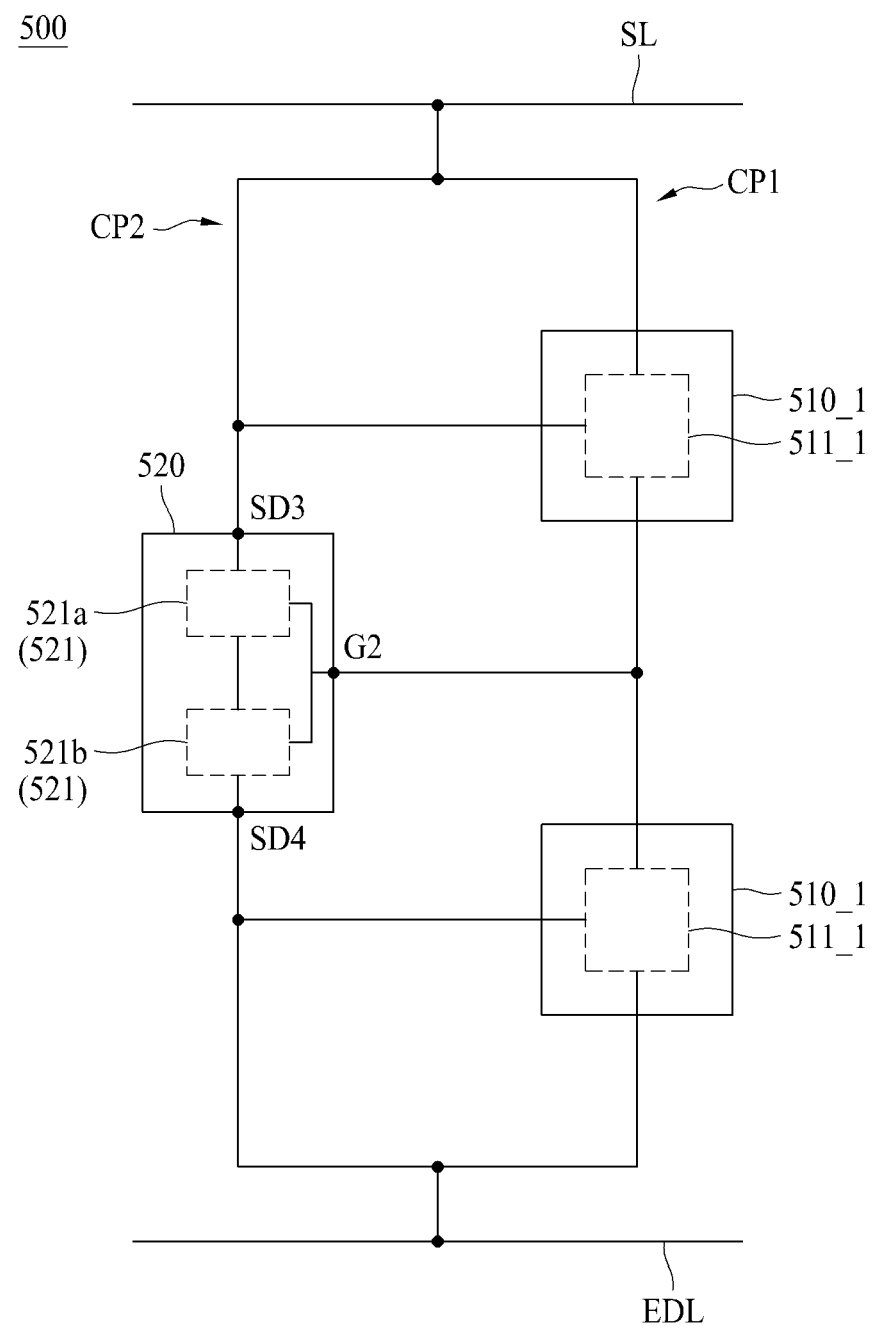
FIG. 8 is a block diagram illustrating an equivalent circuit of an electrostatic discharge circuit according to still another aspect of the present disclosure.

FIG. 8 is a block diagram illustrating an equivalent circuit of an electrostatic discharge circuit according to still another aspect of the present disclosure.

The electrostatic discharge circuit 500 of FIG. 8 may be embodied by modifying the structure of the second thin film transistor 520 of the electrostatic discharge circuit 500 in FIG. 2, and may be embodied by increasing the number of the second unit thin film transistors 521 included in the second thin film transistor 520.

In description of the electrostatic discharge circuit 500 of FIG. 8, the same structure as that of the electrostatic discharge circuit 500 of FIG. 2 will be briefly described or omitted.

In FIG. 8, the electrostatic discharge circuit 500 includes two first thin film transistors 510 and one second thin film transistor 520 but is not limited thereto. For example, the electrostatic discharge circuit 500, as shown in FIGS. 6 and 7, may include three or more first thin film transistors 510 and two or more second thin film transistors 520.

In FIG. 8, the first thin film transistor 510 includes one first unit thin film transistor 511, and the second thin film transistor 520 includes two second unit thin film transistors. However, the present disclosure is not limited to the example of FIG. 8.

In accordance with the aspect, the first thin film transistor 510 may include two or more first unit thin film transistors 511. In accordance with the aspect, the second thin film transistor 520 may include three or more second unit thin film transistors 521.

In accordance with the aspect, the number of the first unit thin film transistors 511 included in the first thin film transistor 510 may be equal to or different from the number of the second unit thin film transistors 521 included in the second thin film transistor 520. In accordance with the aspect, the numbers of the first unit thin film transistors 511_1 to 511_i included in the plurality of first thin film transistors 510_1 to 510_i may be equal to or different from one another. In accordance with the aspect, the numbers of the second unit thin film transistors 521_1 to 521_i-1 included in the plurality of second thin film transistors 520_1 to 520_i-1 may be equal to or different from one another.

Figure 9:
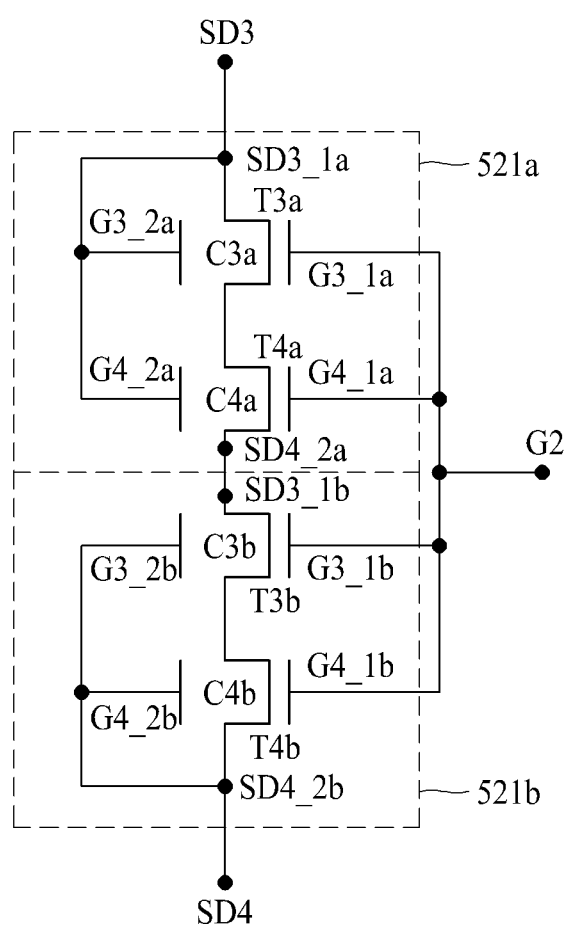
FIG. 9 is a circuit view illustrating a second thin film transistor of the equivalent circuit of FIG. 8.

FIG. 9 is a circuit view illustrating the second thin film transistor of the equivalent circuit of FIG. 8.

The second thin film transistor 520 of FIG. 9 includes two second unit thin film transistors 521*a* and 521*b* connected in series. The (2-1)th unit thin film transistor 521*a* and the (2-2)th thin film transistor 521*b* may be embodied by modifying the structure of the second thin film transistor 520 shown in FIG. 4.

In description of the (2-1)th and (2-2)th unit thin film transistors 521*a* and 521*b* of FIG. 9, the same structure as that of the second unit thin film transistor 521 of FIG. 4 will be briefly described or omitted.

Referring to FIG. 9, each of the (2-1)th unit thin film transistor 521a and the (2-2)th unit thin film transistor 521b may include a third sub thin film transistor T3 and a fourth sub thin film transistor T4.

In the (2-1)th unit thin film transistor 521a, a second gate electrode G3_2a of the third sub thin film transistor T3a and a second gate electrode G4_2a of the fourth sub thin film transistor T4a are commonly connected to the first source/drain SD3_1a of the third sub thin film transistor T3.

In the (2-2)th unit thin film transistor 521a, a second gate electrode G3_2b of the third sub thin film transistor T3b and a second gate electrode G4_2b of the fourth sub thin film transistor T4b are commonly connected to the second source/drain SD4_2b of the fourth sub thin film transistor T4b.

The first source/drain SD3_1a of the third sub thin film transistor T3a of the (2-1)th unit thin film transistor 521a may constitute the first source/drain electrode SD3 of the second thin film transistor 520 or serve as the first source/drain electrode SD3.

The second source/drain SD4_2b of the fourth sub thin film transistor T4b of the (2-2)th unit thin film transistor 521b may constitute the second source/drain electrode SD4_of the second thin film transistor 520 or serve as the first source/drain electrode SD4.

In the (2-1)th unit thin film transistor 521a, a first gate electrode G3 1a of the third sub thin film transistor T3a and a first gate electrode G4_1a of the fourth sub thin film transistor T4a are connected to the gate electrode G2 of the second thin film transistor 520.

In the (2-2)th unit thin film transistor 521b, a first gate electrode G3 1b of the third sub thin film transistor T3b and a first gate electrode G4_1b of the fourth sub thin film transistor T4b are connected to the gate electrode G2 of the second thin film transistor 520.

Therefore, the first gate electrodes G3_1a, G4_1a, G3_1b and G4_1b of the sub thin film transistors T3a, T4a, T3b and T4b constituting the second thin film transistor 520 are commonly connected to the gate electrode G2 of the second thin film transistor 520, and may constitute the gate electrode G2 of the second thin film transistor 520 or serve as the gate electrode G2.

The second source/drain SD4_2a of the fourth sub thin film transistor T4a of the (2-1)th unit thin film transistor 521a and the first source/drain SD3_1b of the third sub thin film transistor T3b of the (2-2)th unit thin film transistor 521b may be one element. For example, an area between a channel portion C4a of the fourth sub thin film transistor T4a of the (2-1)th unit thin film transistor 521a and a channel portion C3b of the third sub thin film transistor T3b of the (2-2)th unit thin film transistor 521b may serve as the second source/drain SD4_2a of the fourth sub thin film transistor T4a of the (2-1)th unit thin film transistor 521a and the first source/drain SD3_1b of the third sub thin film transistor T3b of the (2-2)th unit thin film transistor 521b.

Figure 10:
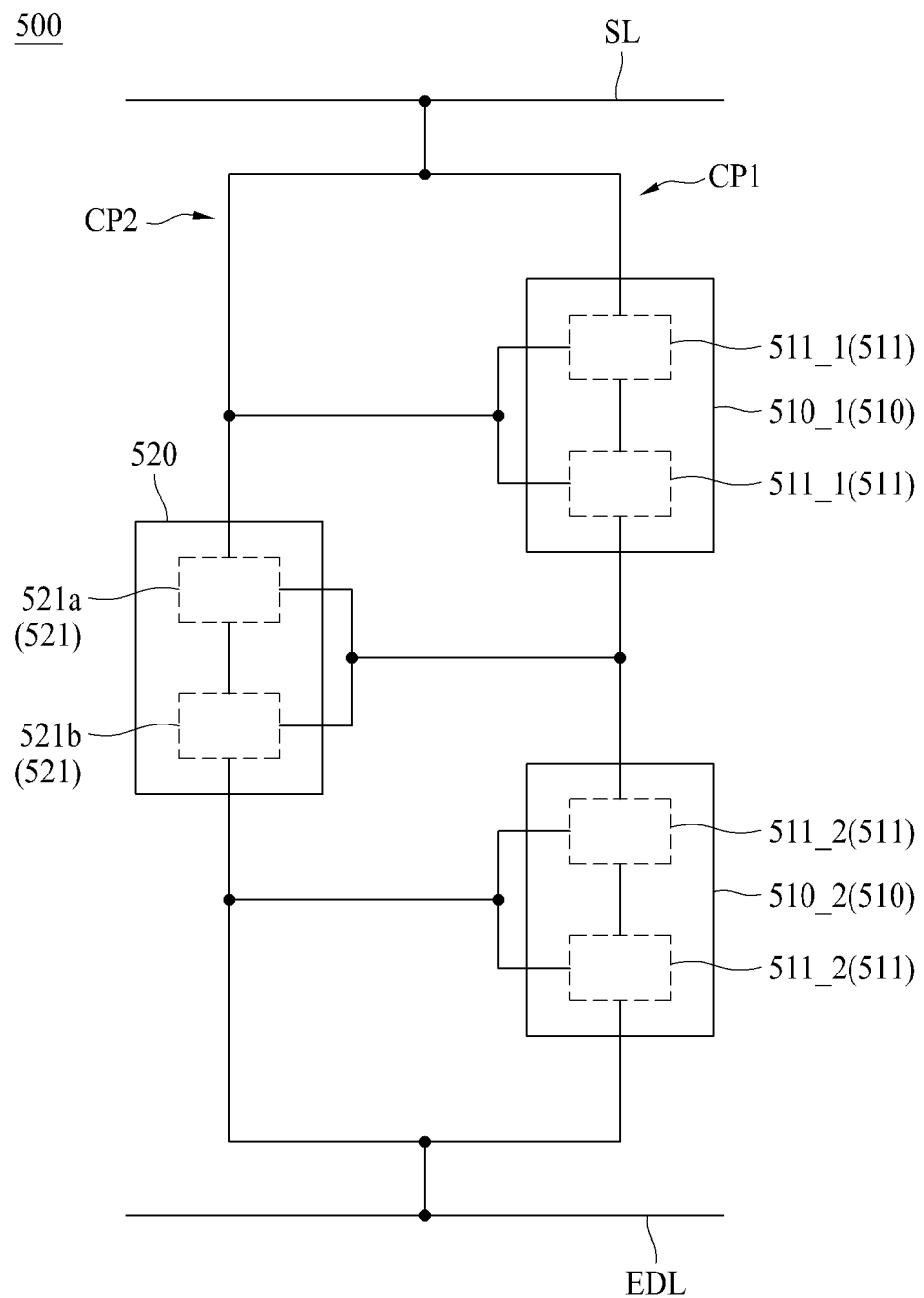
FIG. 10 is a block diagram illustrating an equivalent circuit of an electrostatic discharge circuit according to further still another aspect of the present disclosure.

FIG. 10 is a block diagram illustrating an equivalent circuit of an electrostatic discharge circuit according to further still another aspect of the present disclosure.

The electrostatic discharge circuit 500 of FIG. 10 may be embodied by modifying the structure of the electrostatic discharge circuit 500 in FIG. 2, or may be embodied by modifying the structure of the first thin film transistor 510 of the electrostatic discharge circuit 500 in FIG. 8. For example, in view of the electrostatic discharge circuit 500 of FIG. 2, the electrostatic discharge circuit 500 of FIG. 10 may be embodied by increasing the number of the first and second unit thin film transistors 511 and 521 respectively included in the first and second thin film transistors 510 and 520. For example, in view of the electrostatic discharge circuit 500 of FIG. 8, the electrostatic discharge circuit 500 of FIG. 10 may be embodied by increasing the number of the first unit thin film transistors 511 included in the first thin film transistor 510.

In description of the electrostatic discharge circuit 500 of FIG. 10, the same structure as that of the electrostatic discharge circuit 500 of FIG. 2 and the same structure as that of the electrostatic discharge circuit 500 of FIG. 8 will be briefly described or omitted.

In FIG. 10, the electrostatic discharge circuit 500 includes two first thin film transistors 510 and one second thin film transistor 520 but is not limited thereto. For example, the electrostatic discharge circuit 500, as shown in FIGS. 6 and 7, may include three or more first thin film transistors 510 and two or more second thin film transistors 520.

In FIG. 10, the first thin film transistor 510 includes one first unit thin film transistor 511, and the second thin film transistor 520 includes two second unit thin film transistors. However, the present disclosure is not limited to the example of FIG. 10.

In accordance with the aspect, the first thin film transistor 510 may include three or more first unit thin film transistors 511 connected in series. In accordance with the aspect, the second thin film transistor 520 may include three or more second unit thin film transistors 521 connected in series.

In accordance with the aspect, the number of the first unit thin film transistors 511 included in the first thin film transistor 510 may be equal to or different from the number of the second unit thin film transistors 521 included in the second thin film transistor 520. In accordance with the aspect, the numbers of the first unit thin film transistors 511_1 to 511_i included in the plurality of first thin film transistors 510_1 to 510_i may be equal to or different from one another. In accordance with the aspect, the numbers of the second unit thin film transistors 521_1 to 521_i-1 included in the plurality of second thin film transistors 520_1 to 520_i-1 may be equal to or different from one another.

Figure 11:
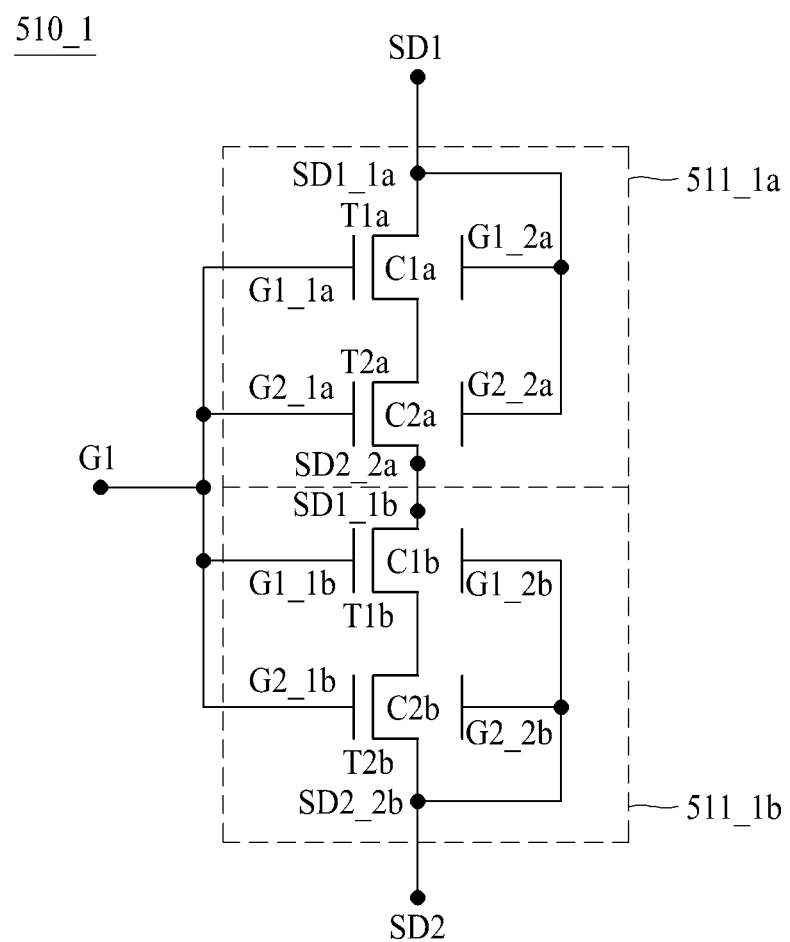
FIG. 11 is a circuit view illustrating a (1-1)th thin film transistor of the equivalent circuit of FIG. 10.

FIG. 11 is a circuit view illustrating the (1-1)th thin film transistor of the equivalent circuit of FIG. 10.

Referring to FIG. 11, the (1-1)th thin film transistor 510_1 may include two first unit thin film transistors 511_1a and 511_1b connected in series.

The (1-1)th unit thin film transistor 511_1a and the (1-2)th unit thin film transistor 511_1b may be embodied by modifying the structure of the first unit thin film transistor 511_1 shown in FIG. 3.

In description of the (1-1)th and (1-2)th unit thin film transistors 511_1a and 511_1b of FIG. 11, the same structure as that of the first unit thin film transistor 511_1 of FIG. 3 will be briefly described or omitted.

Referring to FIG. 11, the (1-1)th unit thin film transistor 511_1a may include first and second sub thin film transistors T1a and T2a, and the (1-2)th unit thin film transistor 511_1b may include first and second sub thin film transistors T1b and T2b. The first sub thin film transistors T1a and T1b are disposed at a side of the signal line SL, and the second sub thin film transistors T2a and T2b are disposed at a side of the electrostatic discharge line EDL.

In the (1-1)th unit thin film transistor 511_1a, a second gate electrode G1_2a of the first sub thin film transistor T1a and a second gate electrode G2_2a of the second sub thin film transistor T2a are commonly connected to the first source/drain SD1_1a of the first sub thin film transistor T1a.

In the (1-2)th unit thin film transistor 511_1b, a second gate electrode G1_2b of the first sub thin film transistor T1b and a second gate electrode G2_2b of the second sub thin film transistor T2b are commonly connected to the second source/drain SD2_2b of the second sub thin film transistor T2b.

The first source/drain SD1 la of the first sub thin film transistor T1a of the (1-1)th unit thin film transistor 511_1a may constitute the first source/drain electrode SD1 of the (1-1)th thin film transistor 510_1 or serve as the first source/drain electrode SD1.

The second source/drain SD2_2b of the second sub thin film transistor T2b of the (1-2)th unit thin film transistor 511-1b may constitute the second source/drain electrode SD2 of the (1-1)th thin film transistor 510_1 or serve as the second source/drain electrode SD2.

In the (1-1)th unit thin film transistor 511_1a, a first gate electrode G1_1a of the first sub thin film transistor T1a and a first gate electrode G2_1a of the second sub thin film transistor T2a are connected to the gate electrode G1 of the (1-1)th thin film transistor 510_1.

In the (1-2)th unit thin film transistor 511_1b, a first gate electrode G1_1b of the first sub thin film transistor T1b and a first gate electrode G2_1b of the second sub thin film transistor T2b are connected to the gate electrode G1 of the (1-1)th thin film transistor 510_1.

Therefore, the first gate electrodes G1_1a, G2_1a, G1_1b and G2_1b of the sub thin film transistors T1a, T2a, T1b and T2b constituting the (1-1)th thin film transistor 510_1 are commonly connected to the gate electrode G1 of the (1-1)th thin film transistor 510_1, and may constitute the gate electrode G1 of the (1-1)th thin film transistor 510_1 or serve as the gate electrode G1.

The second source/drain SD2_2a of the second sub thin film transistor T2a of the (1-1)th unit thin film transistor 511_1a and the first source/drain SD1_1b of the first sub thin film transistor T1b of the (1-2)th unit thin film transistor 511_1b may be one element. For example, an area between a channel portion C2a of the second sub thin film transistor T2a of the (1-1)th unit thin film transistor 511_1a and a channel portion C1b of the first sub thin film transistor T1b of the (1-2)th unit thin film transistor 511_1b may serve as the second source/drain SD2_2a of the second sub thin film transistor T2a of the (1-1)th unit thin film transistor 511_1a and the first source/drain SD1_1b of the first sub thin film transistor T1b of the (1-2)th unit thin film transistor 511_1b.

Figure 12:
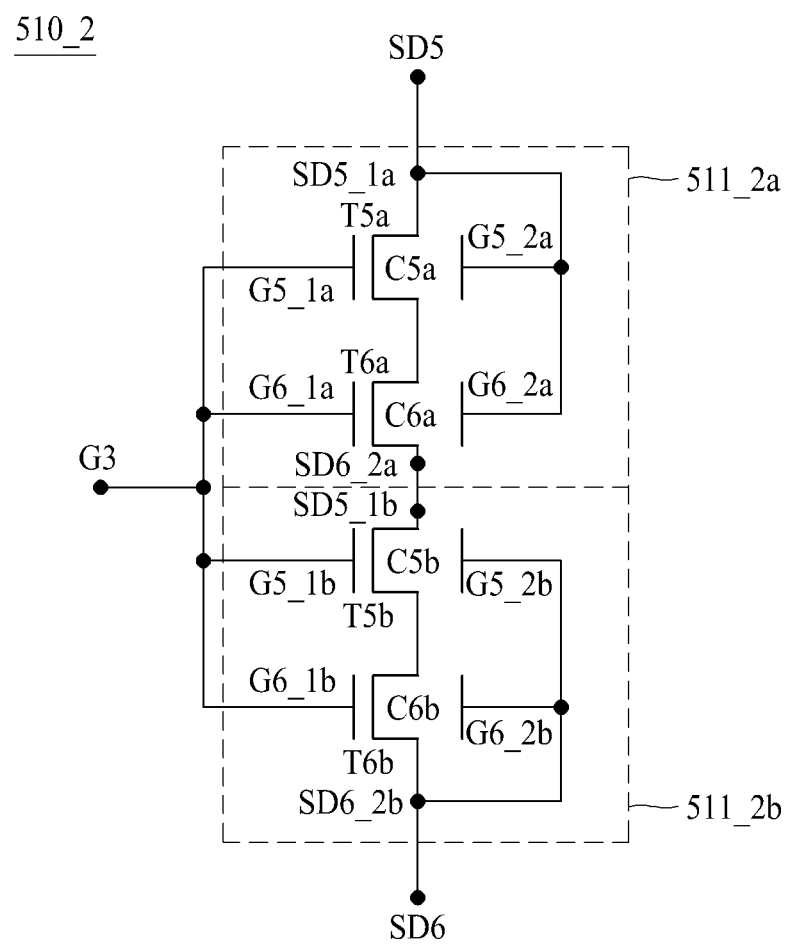
FIG. 12 is a circuit view illustrating a (1-2)th thin film transistor of the equivalent circuit of FIG. 10.

FIG. 12 is a circuit view illustrating the (1-2)th thin film transistor of the equivalent circuit of FIG. 10.

Referring to FIG. 12, the (1-2)th thin film transistor 510_2 may include two first unit thin film transistors 511_2a and 511_2b connected in series.

The (1-1)th unit thin film transistor 511_2a and the (1-2)th unit thin film transistor 511_2b may be embodied by modifying the structure of the first unit thin film transistor 511_2 shown in FIG. 5.

In description of the (1-1)th and (1-2)th unit thin film transistors 511_2a and 511_2b of FIG. 12, the same structure as that of the first unit thin film transistor 511_2 of FIG. 5 will be briefly described or omitted.

Referring to FIG. 12, the (1-1)th unit thin film transistor 511_2a may include fifth and sixth sub thin film transistors T5a and T6a, and the (1-2)th unit thin film transistor 511_2b may include fifth and sixth sub thin film transistors T5b and T6b. The fifth sub thin film transistors T5a and T5b are disposed at a side of the signal line SL, and the sixth sub thin film transistors T6a and T6b are disposed at a side of the electrostatic discharge line EDL.

In the (1-1)th unit thin film transistor 511_2a, a second gate electrode G5_2a of the fifth sub thin film transistor T5a and a second gate electrode G6_2a of the sixth sub thin film transistor T6a are commonly connected to the first source/drain SD5_1a of the fifth sub thin film transistor T5a.

In the (1-2)th unit thin film transistor 511_2b, a second gate electrode G5_2b of the fifth sub thin film transistor T5b and a second gate electrode G5_2b of the sixth sub thin film transistor T6b are commonly connected to the second source/drain SD6_2b of the sixth sub thin film transistor T6b.

The first source/drain SD5_1a of the first sub thin film transistor T5a of the (1-1)th unit thin film transistor 511_2a may constitute the fifth source/drain electrode SD5 of the (1-1)th thin film transistor 510_2 or serve as the fifth source/drain electrode SD5.

The second source/drain SD6_2b of the second sub thin film transistor T6b of the (1-2)th unit thin film transistor 511_2b may constitute the sixth source/drain electrode SD6 of the (1-2)th thin film transistor 510_2 or serve as the sixth source/drain electrode SD6.

In the (1-1)th unit thin film transistor 511_2a, a first gate electrode G5_1a of the fifth sub thin film transistor T5a and a first gate electrode G6_1a of the sixth sub thin film transistor T6a are connected to the gate electrode G1 of the (1-2)th thin film transistor 510_2.

In the (1-2)th unit thin film transistor 511_2b, a first gate electrode G5_1b of the fifth sub thin film transistor T5b and a first gate electrode G6_1b of the sixth sub thin film transistor T6b are connected to the gate electrode G3 of the (1-2)th thin film transistor 510_2.

Therefore, the first gate electrodes G5_1a, G6_1a, G5_1b and G6_1b of the sub thin film transistors T5a, T6a, T5b and T7b constituting the (1-2)th thin film transistor 510_2 are commonly connected to the gate electrode G3 of the (1-2)th thin film transistor 510_2, and may constitute the gate electrode G3 of the (1-2)th thin film transistor 510_2 or serve as the gate electrode G3.

The second source/drain SD6_2a of the sixth sub thin film transistor T6a of the (1-1)th unit thin film transistor 511_2a and the first source/drain SD5_1b of the fifth sub thin film transistor T5b of the (1-2)th unit thin film transistor 511_2b may be one element. For example, an area between a channel portion C6a of the sixth sub thin film transistor T6a of the (1-1)th unit thin film transistor 511_2a and a channel portion C6b of the fifth sub thin film transistor T5b of the (1-2)th unit thin film transistor 511_2b may serve as the second source/drain SD6_2a of the sixth sub thin film transistor T6a of the (1-1)th unit thin film transistor 511_2a and the first source/drain SD5_1b of the fifth sub thin film transistor T5b of the (1-2)th unit thin film transistor 511_2b.

Figure 13:
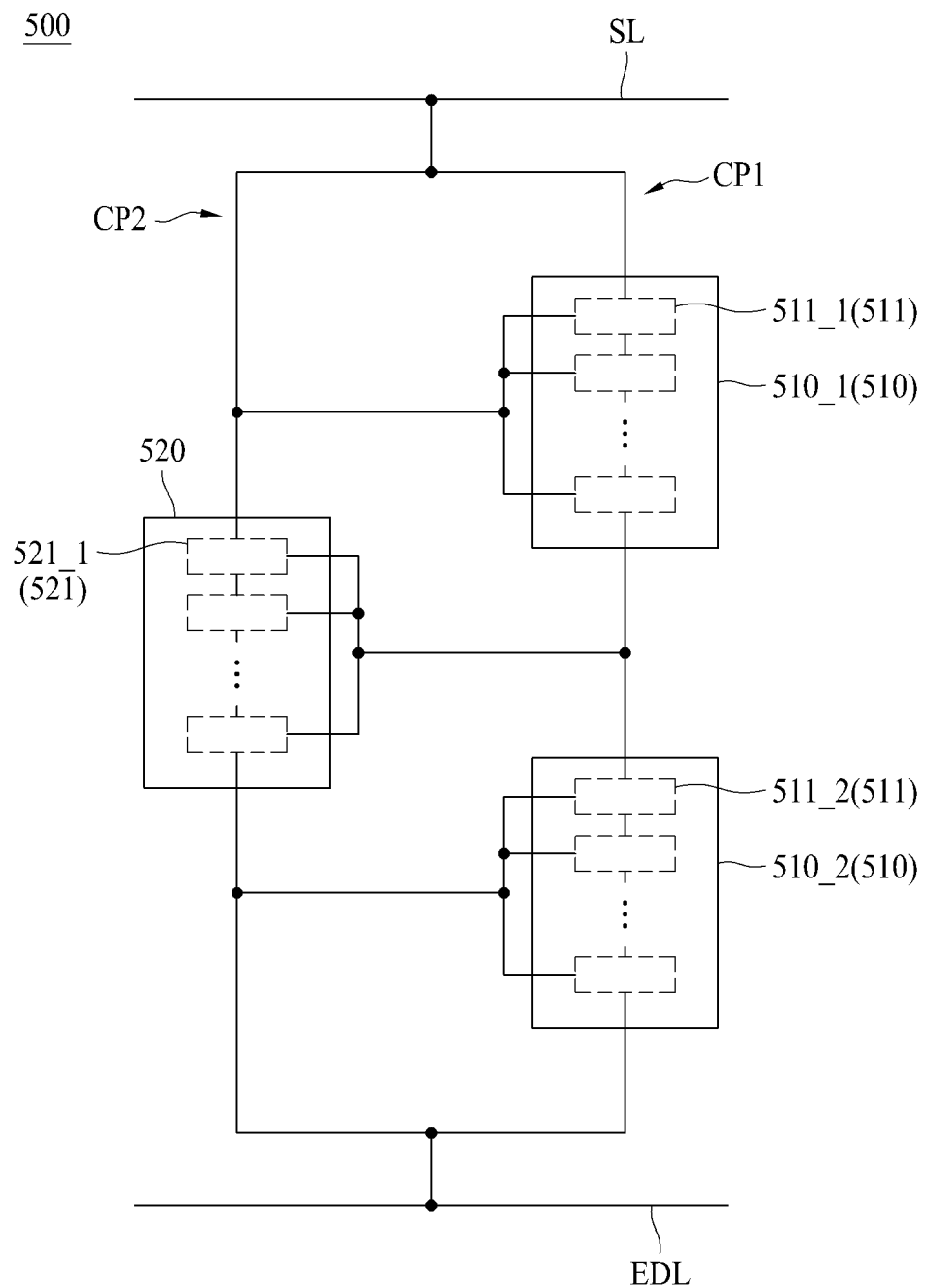
FIG. 13 is a block diagram illustrating an equivalent circuit of an electrostatic discharge circuit according to further still another aspect of the present disclosure.

FIG. 13 is a block diagram illustrating an equivalent circuit of an electrostatic discharge circuit according to further still another aspect of the present disclosure.

In FIG. 13, the electrostatic discharge circuit 500 includes two first thin film transistors 510_1 and 510_2 and one second thin film transistor 520 but is not limited thereto. For example, the electrostatic discharge circuit 500, as shown in FIGS. 6 and 7, may include n number of first thin film transistors 510 (n is a natural number of 2 or more) and (n-1) number of second thin film transistors 520.

Referring to FIG. 13, the (1-1)th thin film transistor 510_1 may include a plurality of (1-1)th unit thin film transistors 511_1, the (1-2)th thin film transistor 510_2 may include a plurality of (1-2)th unit thin film transistors 511_2, and the second thin film transistor 520 may include a plurality of second unit thin film transistors 521_1.

In accordance with the aspect, the first thin film transistor 510_1 may include even number of first unit thin film transistors 511 connected in series, and the second thin film transistor 520 may include even number of second unit thin film transistors 521 connected in series.

For example, when the first thin film transistor 510 includes even number of first unit thin film transistors 511, a first gate electrode of each of sub thin film transistors of ½ number of first unit thin film transistor 511 at the side of the signal line SL and a first gate electrode of each of sub thin film transistors of ½ number of first unit thin film transistor 511 at the side of the electrostatic discharge line EDL are connected to the second current path CP2.

A second gate electrode of each of sub thin film transistors of ½ number of first unit thin film transistor 511 at the side of the signal line SL and a second gate electrode of each of sub thin film transistors of ½ number of first unit thin film transistor 511 at the side of the electrostatic discharge line EDL are connected to the first current path CP1.

The second gate electrode of each of sub thin film transistors of ½ number of first unit thin film transistor 511 at the side of the signal line SL is connected to the first source/drain electrode SD1 of the first thin film transistor 510, and the second gate electrode of each of sub thin film transistors of ½ number of first unit thin film transistor 511 at the side of the electrostatic discharge line EDL is connected to the second source/drain electrode SD2 of the first transistor 510.

For example, when the second thin film transistor 520 includes even number of second unit thin film transistors 521, a first gate electrode of each of sub thin film transistors of ½ number of second unit thin film transistor 521 at the side of the signal line SL and a first gate electrode of each of sub thin film transistors of ½ number of second unit thin film transistor 521 at the side of the electrostatic discharge line EDL are connected to the first current path CP1.

A second gate electrode of each of sub thin film transistors of ½ number of second unit thin film transistor 521 at the side of the signal line SL and a second gate electrode of each of sub thin film transistors of ½ number of second unit thin film transistor 521 at the side of the electrostatic discharge line EDL are connected to the second current path CP2.

The second gate electrode of each of sub thin film transistors of ½ number of second unit thin film transistor 511 at the side of the signal line SL is connected to the first source/drain electrode SD1 of the second thin film transistor 520, and the second gate electrode of each of sub thin film transistors of ½ number of second unit thin film transistor 521 at the side of the electrostatic discharge line EDL is connected to the second source/drain electrode SD2 of the second transistor 520.

In accordance with the aspect, the number of the first unit thin film transistors 511 included in the first thin film transistor 510 may be equal to or different from the number of the second unit thin film transistors 521 included in the second thin film transistor 520. In accordance with the aspect, the numbers of the first unit thin film transistors 511_included in each of the plurality of first thin film transistors 510 may be equal to or different from one another. In accordance with the aspect, the numbers of the second unit thin film transistors 521 included in each of the plurality of second thin film transistors 520 may be equal to or different from one another.

The display apparatus according to the aspect of the present disclosure may be described as follows.

The display apparatus according to one or more aspects of the present disclosure comprises a display panel on which a plurality of pixels are displayed, a plurality of signal lines to which a signal required to drive the display panel is supplied, and an electrostatic discharge circuit connected between each of the plurality of signal lines and the electrostatic discharge line.

According to one or more aspects of the present disclosure, the electrostatic discharge circuit may include first and second current paths between the signal line and the electrostatic discharge line, a first electrostatic discharge circuit connected to the first current path, including a plurality of first thin film transistors having a first gate electrode connected to the second current path and a second gate electrode connected to the first current path, and a second electrostatic discharge circuit connected to the second current path, including at least one second thin film transistor having a first gate electrode connected to the first current path and a second gate electrode connected to the first current path.

According to one or more aspects of the present disclosure, the plurality of signal lines may include at least one of gate lines connected with each of the plurality of pixels, data lines connected with each of the plurality of pixels, or gate control lines between a gate driver for supplying a scan signal to the gate lines and a controller for controlling the gate driver.

According to one or more aspects of the present disclosure, each of the first and second thin film transistors may include one or more of first and second unit thin film transistors comprised of two sub thin film transistors connected in series.

According to one or more aspects of the present disclosure, a second gate electrode of the first thin film transistor and a second gate electrode of the second thin film transistor may be light shields.

According to one or more aspects of the present disclosure, the sub thin film transistor may be a double gate coplanar type.

According to one or more aspects of the present disclosure, the first unit thin film transistor may include a first sub thin film transistor at a side of the signal line, and a second sub thin film transistor at a side of the electrostatic discharge line, and a first gate electrode of each of the first and second sub thin film transistors may be connected to the second current path, and a second gate electrode of each of the first and second sub thin film transistors may be connected to the first current path.

According to one or more aspects of the present disclosure, a second gate electrode of the first sub thin film transistor may be connected to a first source/drain electrode of the first thin film transistor, and a second gate electrode of the second sub thin film transistor may be connected to a second source/drain electrode of the second thin film transistor.

According to one or more aspects of the present disclosure, a first source/drain of the first sub thin film transistor may be connected to the first source/drain electrode of the first thin film transistor, a second source/drain of the second sub thin film transistor may be connected to the second source/drain electrode of the first thin film transistor, and a second source/drain of the first sub thin film transistor may be connected to a first source/drain of the second sub thin film transistor.

According to one or more aspects of the present disclosure, an area between a channel portion of the first sub thin film transistor and a channel portion of the second sub thin film transistor may constitute the second source/drain of the first sub thin film transistor and the first source/drain of the second sub thin film transistor.

According to one or more aspects of the present disclosure, the second unit thin film transistor may include a first sub thin film transistor at a side of the signal line, and a second sub thin film transistor at a side of the electrostatic discharge line, and the first gate electrode of each of the first and second sub thin film transistors may be connected to the first current path, and the second gate electrode of the first and second sub thin film transistors may be connected to the second current path.

According to one or more aspects of the present disclosure, the second gate electrode of the first sub thin film transistor may be connected to the first source/drain electrode of the second thin film transistor, and the second gate electrode of the second sub thin film transistor may be connected to the second source/drain electrode of the second thin film transistor.

According to one or more aspects of the present disclosure, the first source/drain of the first sub thin film transistor may be connected to the first source/drain electrode of the second thin film transistor, the second source/drain of the second sub thin film transistor may be connected to the second source/drain electrode of the second thin film transistor, and the second source/drain of the first sub thin film transistor may be connected to the first source/drain of the second sub thin film transistor.

According to one or more aspects of the present disclosure, an area between a channel portion of the first sub thin film transistor and a channel portion of the second sub thin film transistor may constitute the second source/drain of the first sub thin film transistor and the first source/drain of the second sub thin film transistor.

According to one or more aspects of the present disclosure, the first thin film transistor may include even number of first unit thin film transistors connected in series, the first gate electrode of each of all the sub thin film transistors included in the first thin film transistor may be connected to the second current path, and the second gate electrode of each of all the sub thin film transistors included in the first thin film transistor may be connected to the first current path.

According to one or more aspects of the present disclosure, a second gate electrode of each of sub thin film transistors of ½ number of first unit thin film transistor at a side of the signal line may be connected to the first source/drain electrode of the first thin film transistor, and a second gate electrode of each of sub thin film transistors of ½ number of first unit thin film transistor at a side of the electrostatic discharge line may be connected to the second source/drain of the first thin film transistor.

According to one or more aspects of the present disclosure, the second thin film transistor may include even number of second unit thin film transistors connected in series, the first gate electrode of each of all the sub thin film transistors included in the second thin film transistor may be connected to the first current path, and the second gate electrode of each of all the sub thin film transistors included in the second thin film transistor may be connected to the second current path.

According to one or more aspects of the present disclosure, a second gate electrode of each of sub thin film transistors of ½ number of second unit thin film transistor at a side of the signal line may be connected to the first source/drain electrode of the second thin film transistor, and a second gate electrode of each of sub thin film transistors of ½ number of second unit thin film transistor at a side of the electrostatic discharge line may be connected to the second source/drain of the second thin film transistor.

According to one or more aspects of the present disclosure, the first source/drain electrode may be a source/drain electrode at a side of the signal line, and the second source/drain electrode may be a source/drain electrode at a side of the electrostatic discharge line.

According to one or more aspects of the present disclosure, the first electrostatic discharge circuit may include n number of first thin film transistors (n is a natural number of 2 or more), and the second electrostatic discharge circuit may include (n-1) number of second thin film transistors.

According to one or more aspects of the present disclosure, the second thin film transistor may be disposed between the first thin film transistors, and a first gate electrode of a (2-(n-1))th thin film transistor may be connected to a first current path between a (1-(n-1))th thin film transistor and a (1-n)th thin film transistor.

According to one or more aspects of the present disclosure, since a display device includes an electrostatic discharge circuit comprised of a coplanar type thin film transistor that is less affected by parasitic capacitance, it is possible to implement a display apparatus of a large screen.

According to one or more aspects of the present disclosure, since a leakage current in a coplanar type thin film transistor may be reduced, it is possible to implement a display device capable of solving a problem of increasing power consumption that may occur in an electrostatic discharge circuit comprised of the coplanar type thin film transistor.

The features, structures and effects described in the aforementioned present disclosure are included in at least one example of the present disclosure, and are not limited to one example. Moreover, the features, structures and effects exemplified in at least one example of the present disclosure may be carried out through combination with or modification in other examples by the person with ordinary skill in the art to which the present disclosure pertains. Therefore, the descriptions related to such combination and modification should be construed to be included in the scope of the present disclosure.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A display apparatus comprising:
   a display panel on which a plurality of pixels are displayed;
   a plurality of signal lines to which a signal to drive the display panel is supplied; and
   an electrostatic discharge circuit connected between each of the plurality of signal lines and the electrostatic discharge line,
   wherein the electrostatic discharge circuit includes:
   first and second current paths between the signal line and the electrostatic discharge line;
   a first electrostatic discharge circuit connected to the first current path and including a plurality of first thin film transistors having a first gate electrode connected to the second current path and a second gate electrode connected to the first current path; and a second electrostatic discharge circuit connected to the second current path and including at least one second thin film transistor having a first gate electrode connected to the first current path and a second gate electrode connected to the first current path.

2. The display apparatus of claim 1, wherein the plurality of signal lines include at least one of:
gate lines connected with each of the plurality of pixels;
data lines connected with each of the plurality of pixels; or
gate control lines between a gate driver for supplying a scan signal to the gate lines and a controller for controlling the gate driver.

3. The display apparatus of claim 1, wherein each of the first and second thin film transistors includes one or more of first and second unit thin film transistors comprised of two sub thin film transistors connected in series.

4. The display apparatus of claim 1, wherein the second gate electrode of the first thin film transistors and the second gate electrode of the second thin film transistors are light shields.

5. The display apparatus of claim 3, wherein the sub thin film transistor includes a double gate coplanar type.

6. The display apparatus of claim 3, wherein the first unit thin film transistor includes:
a first sub thin film transistor disposed at a side of the signal line; and
a second sub thin film transistor disposed at a side of the electrostatic discharge line, and
a first gate electrode of each of the first and second sub thin film transistors is connected to the second current path, and a second gate electrode of each of the first and second sub thin film transistors is connected to the first current path.

7. The display apparatus of claim 6, wherein the second gate electrode of the first sub thin film transistor is connected to a first source/drain electrode of the first thin film transistor, and the second gate electrode of the second sub thin film transistor is connected to a second source/drain electrode of the second thin film transistor.

8. The display apparatus of claim 6, wherein a first source/drain of the first sub thin film transistor is connected to the first source/drain electrode of the first thin film transistor, a second source/drain of the second sub thin film transistor is connected to the second source/drain electrode of the first thin film transistor, and a second source/drain of the first sub thin film transistor is connected to a first source/drain of the second sub thin film transistor.

9. The display apparatus of claim 8, wherein an area between a channel portion of the first sub thin film transistor and a channel portion of the second sub thin film transistor constitutes the second source/drain of the first sub thin film transistor and the first source/drain of the second sub thin film transistor.

10. The display apparatus of claim 3, wherein the second unit thin film transistor includes:
a first sub thin film transistor disposed at a side of the signal line; and
a second sub thin film transistor disposed at a side of the electrostatic discharge line, and
wherein the first gate electrode of each of the first and second sub thin film transistors is connected to the first current path, and the second gate electrode of the first and second sub thin film transistors is connected to the second current path.

11. The display apparatus of claim 10, wherein the second gate electrode of the first sub thin film transistor is connected to the first source/drain electrode of the second thin film transistor, and the second gate electrode of the second sub thin film transistor is connected to the second source/drain electrode of the second thin film transistor.

12. The display apparatus of claim 10, wherein the first source/drain of the first sub thin film transistor is connected to the first source/drain electrode of the second thin film transistor, the second source/drain of the second sub thin film transistor is connected to the second source/drain electrode of the second thin film transistor, and the second source/drain of the first sub thin film transistor is connected to the first source/drain of the second sub thin film transistor.

13. The display apparatus of claim 12, wherein an area between a channel portion of the first sub thin film transistor and a channel portion of the second sub thin film transistor constitutes the second source/drain of the first sub thin film transistor and the first source/drain of the second sub thin film transistor.

14. The display apparatus of claim 3, wherein the first thin film transistor includes even number of first unit thin film transistors connected in series, the first gate electrode of each of all the sub thin film transistors included in the first thin film transistor is connected to the second current path, and the second gate electrode of each of all the sub thin film transistors included in the first thin film transistor is connected to the first current path.

15. The display apparatus of claim 4, wherein a second gate electrode of each of sub thin film transistors of ½ number of first unit thin film transistor disposed at a side of the signal line is connected to the first source/drain electrode of the first thin film transistor, and a second gate electrode of each of sub thin film transistors of ½ number of first unit thin film transistor at a side of the electrostatic discharge line is connected to the second source/drain of the first thin film transistor.

16. The display apparatus of claim 3, wherein the second thin film transistor includes even number of second unit thin film transistors connected in series, the first gate electrode of each of all the sub thin film transistors included in the second thin film transistor is connected to the first current path, and the second gate electrode of each of all the sub thin film transistors included in the second thin film transistor is connected to the second current path.

17. The display apparatus of claim 16, wherein a second gate electrode of each of sub thin film transistors of ½ number of second unit thin film transistor at a side of the signal line is connected to the first source/drain electrode of the second thin film transistor, and a second gate electrode of each of sub thin film transistors of ½ number of second unit thin film transistor at a side of the electrostatic discharge line is connected to the second source/drain of the second thin film transistor.

18. The display apparatus of claim 7, wherein the first source/drain electrode is a source/drain electrode dispose at a side of the signal line, and the second source/drain electrode is a source/drain electrode disposed at a side of the electrostatic discharge line.

19. The display apparatus of claim 1, wherein the first electrostatic discharge circuit includes n number of first thin film transistors (n being a natural number of 2 or more), and the second electrostatic discharge circuit includes (n-1) number of second thin film transistors.

20. The display apparatus of claim 19, wherein the second thin film transistor is disposed between the first thin film transistors, and a first gate electrode of a (2-(n-1))th thin film transistor is connected to a first current path between a (1-(n-1))th thin film transistor and a (1-n)th thin film transistor.

\* \* \* \* \*